(12) United States Patent
Kishi

(10) Patent No.: US 12,088,939 B2
(45) Date of Patent: Sep. 10, 2024

(54) IMAGE PICKUP DEVICE THAT IS PROVIDED WITH PERIPHERAL CIRCUITS TO PREVENT CHIP AREA FROM BEING INCREASED, AND IMAGE PICKUP APPARATUS

(71) Applicant: CANON KABUSHIKI KAISHA, Tokyo (JP)

(72) Inventor: Takafumi Kishi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 18/155,189

(22) Filed: Jan. 17, 2023

(65) Prior Publication Data

US 2023/0156364 A1 May 18, 2023

Related U.S. Application Data

(63) Continuation of application No. 17/223,391, filed on Apr. 6, 2021, now Pat. No. 11,588,996, which is a
(Continued)

(30) Foreign Application Priority Data

Aug. 2, 2011 (JP) .................................. 2011-169291
Jul. 18, 2012 (JP) .................................. 2012-159605

(51) Int. Cl.
*H04N 25/75* (2023.01)
*H01L 27/146* (2006.01)
(Continued)

(52) U.S. Cl.
CPC ....... *H04N 25/75* (2023.01); *H01L 27/14634* (2013.01); *H01L 27/14636* (2013.01);
(Continued)

(58) Field of Classification Search
CPC ...... H04N 25/75; H04N 25/767; H04N 25/79; H04N 25/77; H04N 25/76;
(Continued)

(56) References Cited

U.S. PATENT DOCUMENTS

| 6,816,196 B1 | 11/2004 | Mann |
| 6,940,059 B2 | 9/2005 | Mabuchi |

(Continued)

FOREIGN PATENT DOCUMENTS

| CN | 1393844 A | 1/2003 |
| CN | 1497954 A | 5/2004 |

(Continued)

OTHER PUBLICATIONS

Office Action dated Jun. 6, 2023, in Japanese Patent Application No. 2021-165009.
(Continued)

*Primary Examiner* — Ahmed A Berhan
(74) *Attorney, Agent, or Firm* — Venable LLP

(57) ABSTRACT

An image pickup device which suppresses an increase in chip area of peripheral circuits without degrading the performance of a pixel section and makes it possible to prevent costs from being increased. The image pickup device includes a first semiconductor substrate and a second semiconductor substrate. A pixel section includes photo diodes each for generate electric charges by photoelectric conversion, floating diffusions each for temporarily storing the electric charges generated by the photo diode, and amplifiers each connected to the floating diffusion, for outputting a signal dependent on a potential of the associated floating diffusion. Column circuits are connected to vertical signal lines, respectively, for performing predetermined processing on signals output from the pixel section to vertical signal lines.

17 Claims, 28 Drawing Sheets

Related U.S. Application Data continuation of application No. 16/673,100, filed on Nov. 4, 2019, now Pat. No. 10,999,550, which is a continuation of application No. 15/437,633, filed on Feb. 21, 2017, now Pat. No. 10,506,190, which is a continuation of application No. 13/558,696, filed on Jul. 26, 2012, now Pat. No. 9,666,626.

(51) Int. Cl.
  *H04N 25/767* (2023.01)
  *H04N 25/79* (2023.01)

(52) U.S. Cl.
  CPC .... *H01L 27/14638* (2013.01); *H01L 27/1464* (2013.01); *H04N 25/767* (2023.01); *H04N 25/79* (2023.01); *H01L 27/14643* (2013.01)

(58) Field of Classification Search
  CPC ......... H01L 27/14634; H01L 27/14636; H01L 27/14638; H01L 27/1464; H01L 27/14643; H01L 27/146
  See application file for complete search history.

(56) References Cited

U.S. PATENT DOCUMENTS

| | | | |
|---|---|---|---|
| 7,164,113 B2 | 1/2007 | Inokuma et al. | |
| 7,271,409 B2 | 9/2007 | Young et al. | |
| 7,470,893 B2 | 12/2008 | Suzuki et al. | |
| 7,565,033 B2 | 7/2009 | Hanson et al. | |
| 7,812,874 B2 | 10/2010 | Iwabuchi et al. | |
| 7,868,283 B2 | 1/2011 | Mabuchi | |
| 8,106,983 B2 | 1/2012 | Hirota et al. | |
| 8,144,227 B2 | 3/2012 | Kobayashi | |
| 8,159,584 B2 | 4/2012 | Iwabuchi et al. | |
| 8,164,126 B2 | 4/2012 | Moon et al. | |
| 8,169,520 B2 | 5/2012 | Iwabuchi et al. | |
| 8,570,417 B2 | 10/2013 | Oike et al. | |
| 8,786,748 B2 | 7/2014 | Oike et al. | |
| 8,854,517 B2 | 10/2014 | Honda et al. | |
| 8,885,080 B2 | 11/2014 | Kobayashi | |
| 8,946,610 B2 | 2/2015 | Iwabuchi et al. | |
| 9,087,758 B2 | 7/2015 | Mabuchi | |
| 9,666,626 B2 | 5/2017 | Kishi | |
| 2005/0018064 A1 | 1/2005 | Itoh et al. | |
| 2006/0023109 A1 | 2/2006 | Mabuchi et al. | |
| 2008/0042046 A1* | 2/2008 | Mabuchi | H01L 27/14806 257/E27.151 |
| 2010/0245647 A1* | 9/2010 | Honda | H04N 25/76 348/308 |
| 2010/0259662 A1* | 10/2010 | Oike | H04N 25/772 348/308 |
| 2010/0276572 A1* | 11/2010 | Iwabuchi | H04N 23/54 257/443 |
| 2011/0102657 A1* | 5/2011 | Takahashi | H01L 27/1464 257/E27.122 |
| 2011/0157445 A1 | 6/2011 | Itonaga et al. | |
| 2012/0120293 A1* | 5/2012 | Mabuchi | H04N 25/67 348/E5.031 |
| 2012/0293698 A1 | 11/2012 | Sukegawa et al. | |
| 2012/0307030 A1* | 12/2012 | Blanquart | H04N 25/79 348/76 |
| 2013/0092820 A1 | 4/2013 | Takemoto | |
| 2014/0175592 A1 | 6/2014 | Iwabuchi et al. | |
| 2015/0281605 A1 | 10/2015 | Mabuchi | |
| 2016/0255296 A1 | 9/2016 | Iwabuchi et al. | |
| 2018/0166490 A1 | 6/2018 | Wakiyama et al. | |

FOREIGN PATENT DOCUMENTS

| | | |
|---|---|---|
| CN | 1507743 A | 6/2004 |
| CN | 1643693 A | 7/2005 |
| CN | 201654182 U | 11/2010 |
| JP | 2000-324397 A | 11/2000 |
| JP | 2005-518688 A | 6/2005 |
| JP | 2006-049338 A | 2/2006 |
| JP | 2006-049361 A | 2/2006 |
| JP | 2006-237772 A | 9/2006 |
| JP | 2007-115994 A | 5/2007 |
| JP | 2008-048313 A | 2/2008 |
| JP | 2008-211220 A | 9/2008 |
| JP | 2008-235478 A | 10/2008 |
| JP | 2009-152234 A | 7/2009 |
| JP | 2010-225927 A | 10/2010 |
| JP | 2010-245955 A | 10/2010 |
| JP | 2010-283787 A | 12/2010 |
| JP | 2012-104684 A | 5/2012 |
| JP | 2013-090127 A | 5/2013 |
| KR | 10-2006-0011845 A | 2/2006 |
| KR | 10-2008-0019652 A | 3/2008 |
| WO | 2006/025232 A1 | 3/2006 |
| WO | 2006/129762 A1 | 12/2006 |
| WO | 2011/083722 A1 | 7/2011 |

OTHER PUBLICATIONS

Office Action dated Sep. 22, 2014, in Chinese Patent Application No. 201210273711.7.
Office Action dated Feb. 22, 2017, in Korean Patent Application No. 10-2017-0020898.
Office Action dated Jan. 16, 2018, in Japanese Patent Application No. 2017-021967.
Office Action dated May 24, 2018, in Chinese Patent Application No. 201610243318.1.
Office Action dated Apr. 16, 2019, in Japanese Patent Application No. 2018-041821.
Office Action dated Jan. 19, 2021, in Japanese Patent Application No. 2020-023422.
Office Action dated Jan. 19, 2023, in German Patent Application No. 102018123875.4.
Office Action dated Aug. 8, 2023, in Japanese Patent Application No. 2022-137140.
Office Action dated Dec. 19, 2023, in Japanese Patent Application No. 2022-137140.

\* cited by examiner

FIG.21
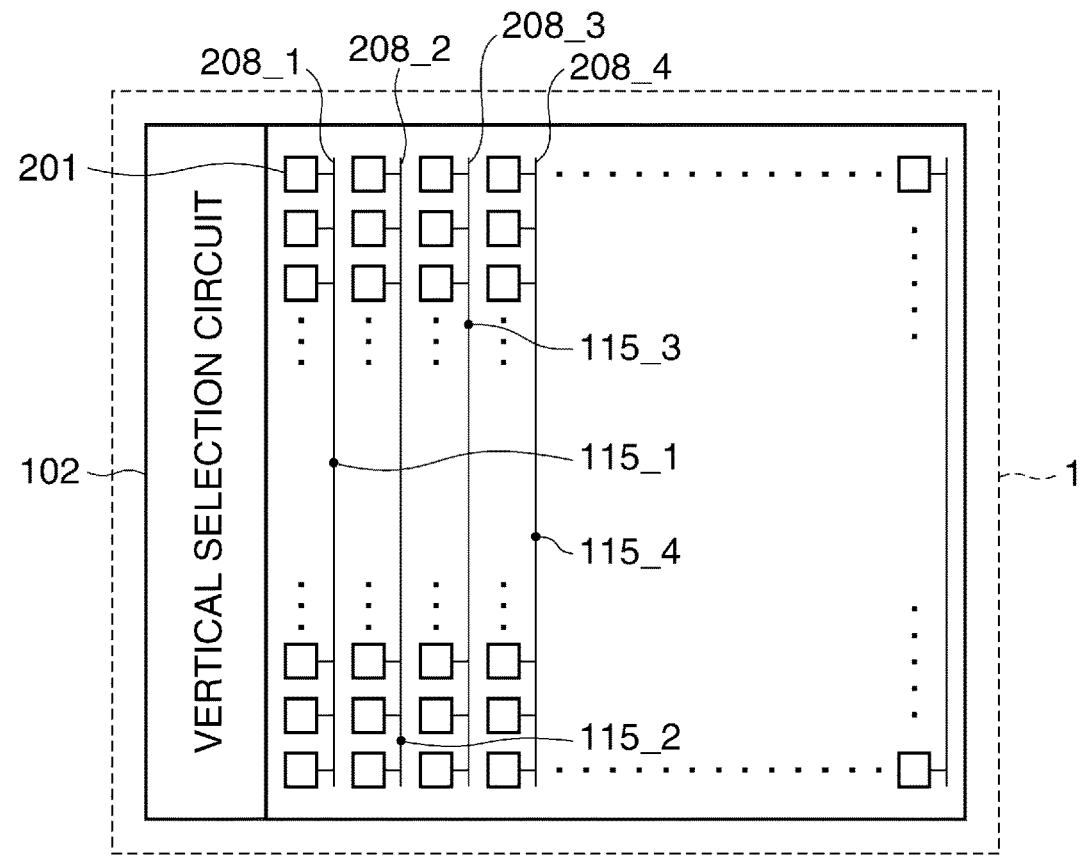
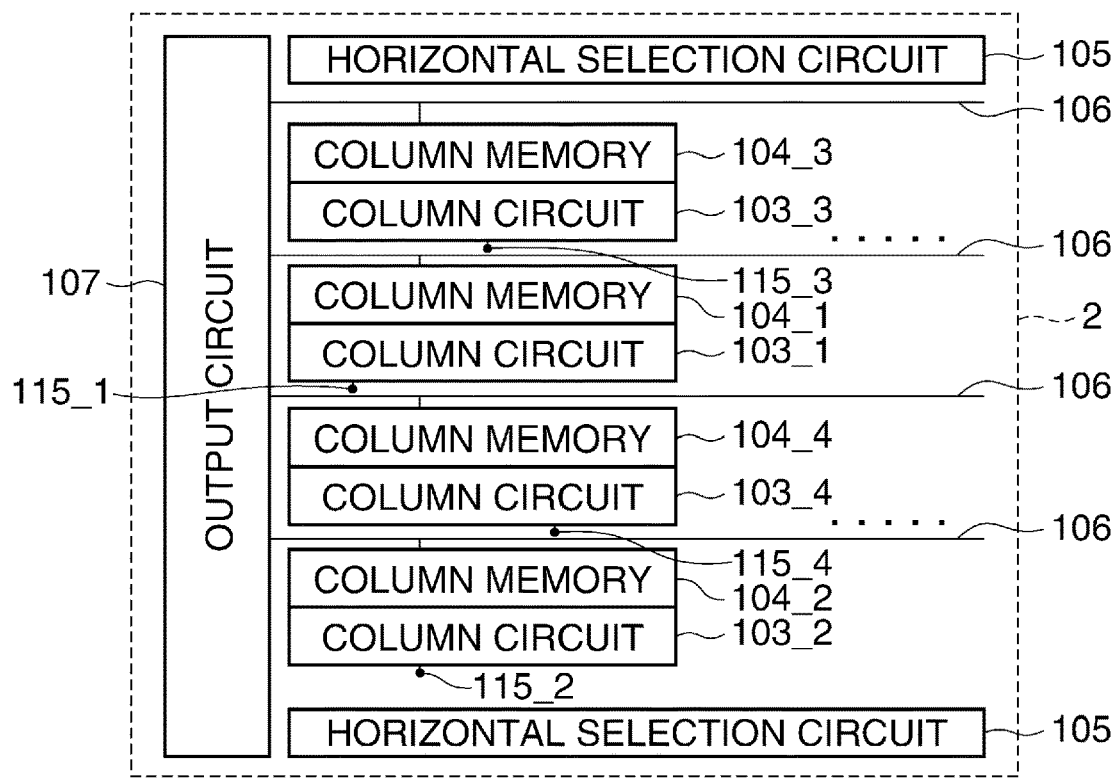

FIG.24
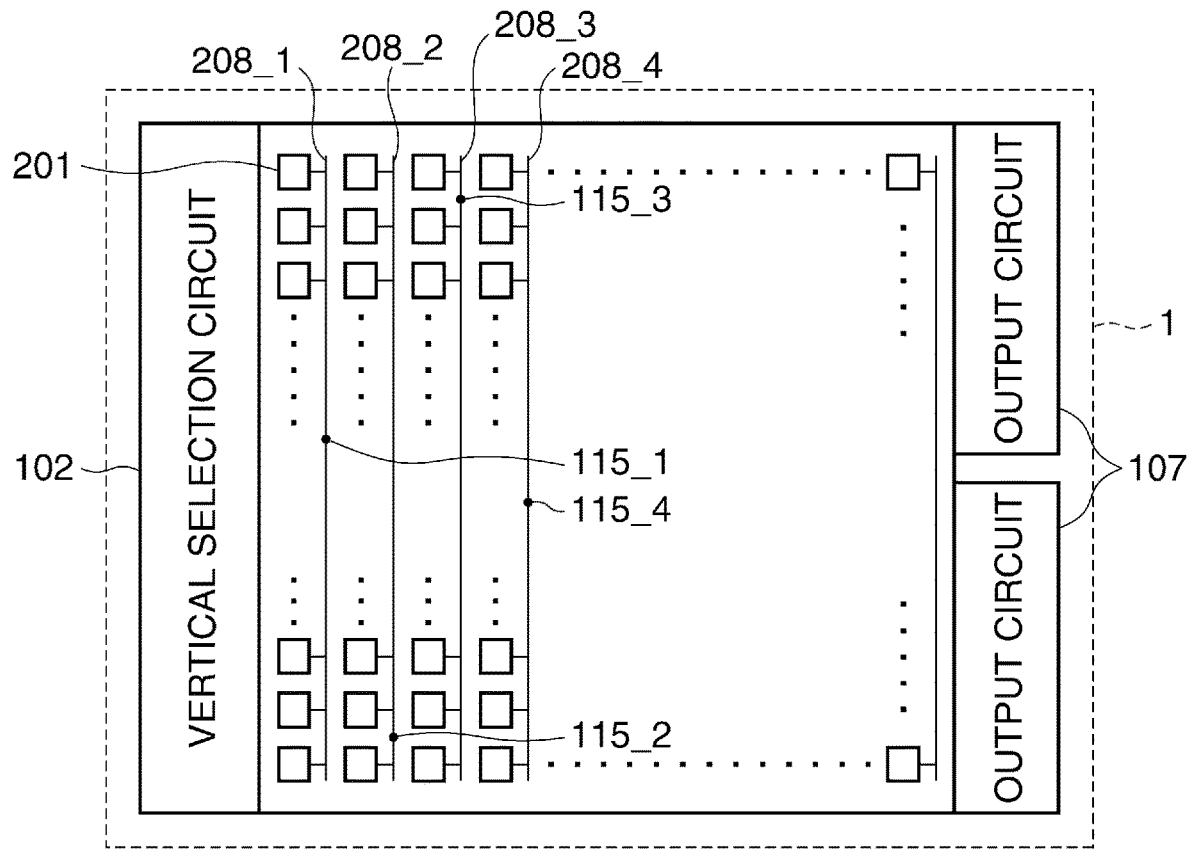
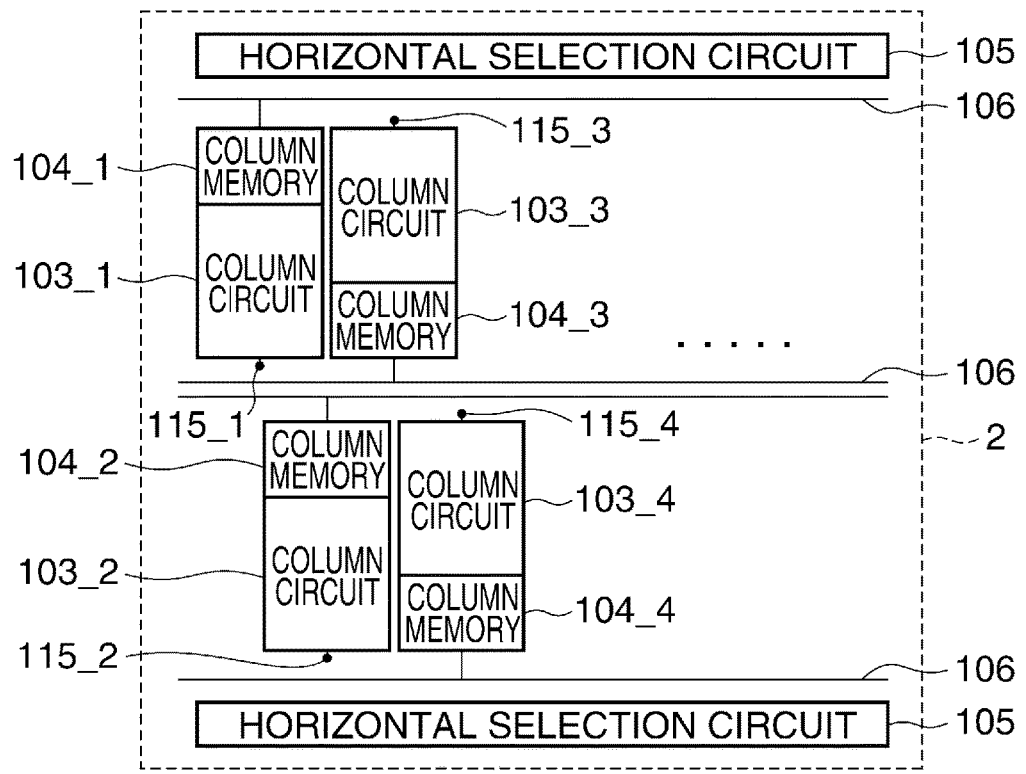

FIG.26
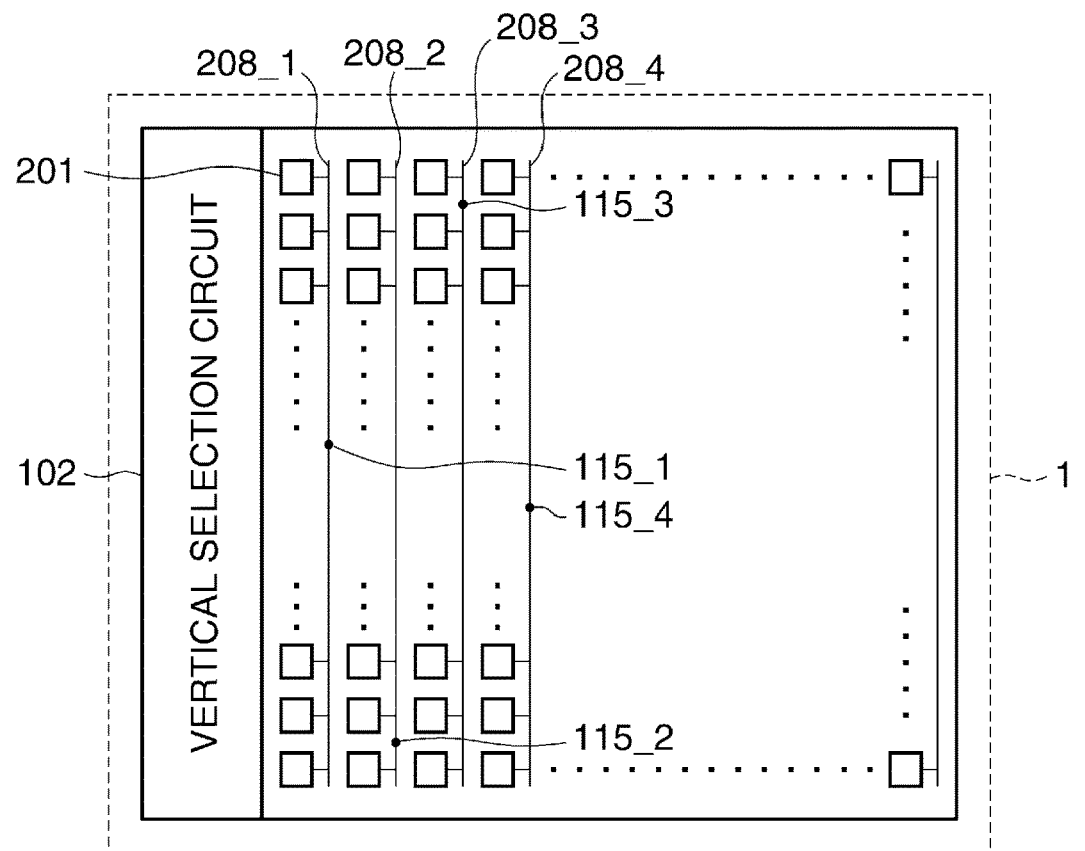
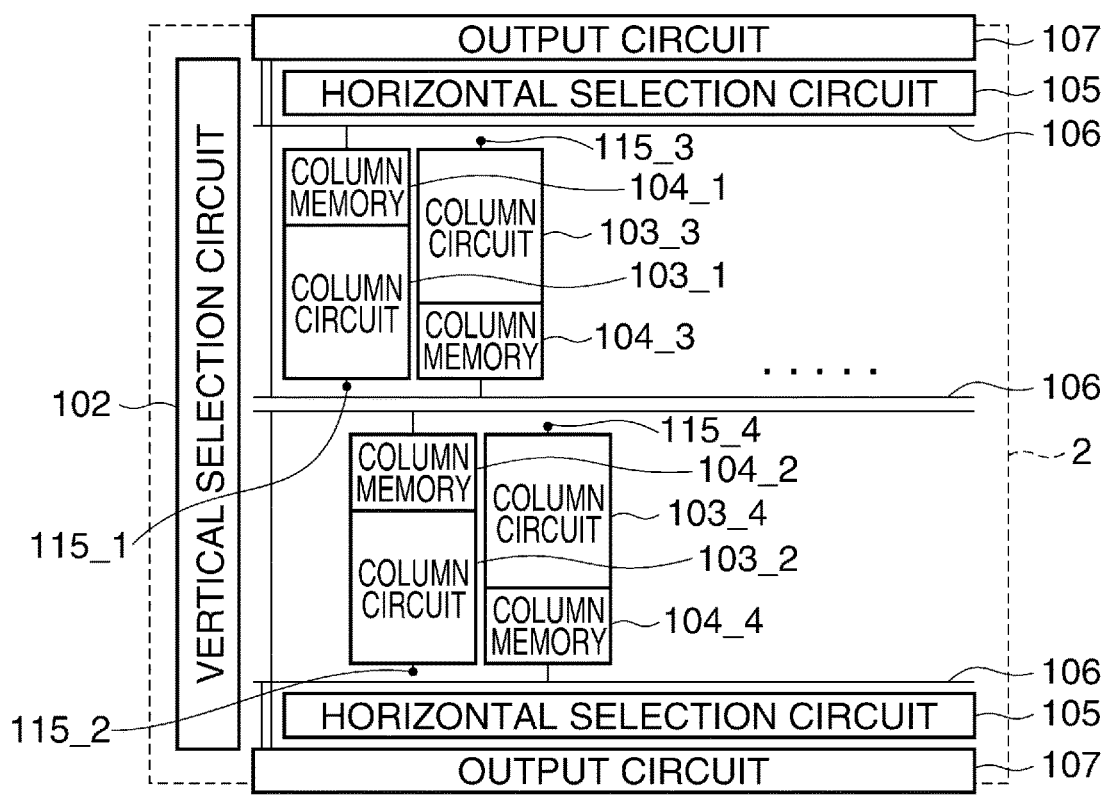

IMAGE PICKUP DEVICE THAT IS PROVIDED WITH PERIPHERAL CIRCUITS TO PREVENT CHIP AREA FROM BEING INCREASED, AND IMAGE PICKUP APPARATUS

This is a continuation of U.S. patent application Ser. No. 17/223,391, filed Apr. 6, 2021, which is a continuation of U.S. patent application Ser. No. 16/673,100, filed Nov. 4, 2019, issuing as U.S. Pat. No. 10,999,550, which is a continuation of U.S. patent application Ser. No. 15/437,633, filed Feb. 21, 2017, issuing as U.S. Pat. No. 10,506,190, which is a continuation of U.S. patent application Ser. No. 13/558,696, filed Jul. 26, 2012, and issuing as U.S. Pat. No. 9,666,626.

BACKGROUND OF THE INVENTION

Field of the Invention

The present invention relates to an image pickup device and an image pickup apparatus, and more particularly to a technique concerning a circuit forming the image pickup device.

Description of the Related Art

Conventionally, there has been developed an image pickup apparatus, such as a digital camera and a digital video camera, which records a shot image using a CMOSAPS (complementary metal oxide semiconductor active pixel sensor) as an image pickup device. The image pickup device includes a pixel section and a peripheral circuit section. The peripheral circuit section reads out a signal from each pixel and is output to the outside as an image signal. The pixel section performs photoelectric conversion by photo diodes, and a pixel circuit formed in the pixel section reads out a signal obtained by photoelectric conversion to the peripheral circuit section.

In recent years, as the pixel becomes finer, as for inside each pixel, the number of circuits is reduced as much as possible and the area of a photo diode is increased, whereby the performance of the image pickup device is ensured. Further, as the function of the image pickup device is improved, the area of the peripheral circuit section is also increased. Therefore, a technique for forming the pixel section and the peripheral circuit section on respective separate chips is being developed. The technique disclosed in Japanese Patent Laid-Open Publication No. 2008-211220 employs a method in which a pixel is formed only by a photo diode and some of switches, and the other switches are formed in a separate chip.

FIG. 27 is a schematic block diagram useful in explaining a conventional image pickup device.

The image pickup device includes a pixel section 101', a vertical selection circuit 102' for selecting at least one of rows of pixels in the pixel section 101', and column circuits 103' each of which performs predetermined processing on signals read from pixels on a row selected by the vertical selection circuit 102' in the pixel section 101'. The image pickup device further includes column memories 104' each of which holds signals which have been processed by the column circuits 103' on a column basis, horizontal selection circuits 105' each of which selects a column of signals held in the column memories 104', and output signal lines 106' each for reading out a signal from a column selected by an associated one of the horizontal selection circuits 105' to an associated one of output circuits 107'. Note that the image pickup device further includes not only illustrated components but also a timing generator which supplies a timing signal to each of the vertical selection circuit 102', the horizontal selection circuits 105', the column circuits 103', etc., a control circuit, and so forth.

The vertical selection circuit 102' sequentially selects a plurality of rows in the pixel section 101', and outputs selected signals to the column memories 104'. The horizontal selection circuits 105' sequentially select signals held in the respective associated column memories 104', and output selected signals to the respective associated output circuits 107' through the associated output signal lines 106'. The pixel section 101' is formed by arranging a plurality of pixels in a two-dimensional array in order to provide a two-dimensional image. These circuits are formed on one semiconductor substrate, and along with finer designing of a semiconductor process, reduction of a pixel pitch and reduction of the area of peripheral circuits are in progress.

FIG. 28 is a diagram showing the configuration of one pixel in the conventional image pickup device, and the configuration of a circuit for reading out a signal from the pixel.

As shown in FIG. 28, a pixel array which provides a two-dimensional image is formed by arranging a plurality of pixels in a two-dimensional array. Each pixel 201' is configured to include a photo diode (hereinafter also referred to as the "PD") 202', a transfer switch 203', a floating diffusion (hereinafter also referred to as the "FD") 204', a reset switch 207', a MOS amplifier 205', and a selection switch 206'.

The PD 202' functions as a photoelectric conversion element which converts light incident through an optical system to an electric signal by photoelectric conversion to thereby generate electric charges. The anode of the PD 202' is connected to a ground line, and the cathode of the PD 202' is connected to the source of the transfer switch 203'. The transfer switch 203' is driven by a transfer pulse ϕTX input to a gate terminal thereof to transfer the electric charges generated in the PD 202' to the FD 204'. The FD 204' functions as a charge-voltage converting section which temporarily accumulates electric charges and converts the accumulated electric charges to a voltage signal.

The MOS amplifier 205' functions as a source follower, and has a gate to which the voltage signal converted from the electric charges in the FD 204' is input. Further, the MOS amplifier 205' has a drain connected to a first power line VDD1 for supplying a first potential, and a source connected to the selection switch 206'. The selection switch 206' is driven by a vertical selection pulse ϕSEL input to a gate thereof, and has a drain connected to the MOS amplifier 205', and a source connected to a vertical signal line (column signal line) 208'. When the vertical selection pulse ϕSEL becomes an active level (high level), the selection switch 206' of each pixel belonging to the corresponding row on the pixel array becomes conductive, whereby the source of the MOS amplifier 205' is connected to the vertical signal line 208'.

The reset switch 207' has a drain connected to a second power line VDD2 for supplying a second potential (reset potential), and a source connected to the FD 204'. Further, the reset switch 207' is driven by a reset pulse ϕRES input to a gate thereof to remove electric charges accumulated in the FD 204'.

A floating diffusion amplifier is formed by not only the FD 204' and the MOS amplifier 205', but also a constant current source 209' for supplying a constant current to the vertical signal line 208'. In each of pixels forming the row selected by the selection switch 206', the electric charges transferred from the PD 202' to the FD 204' is converted to the voltage signal by the FD 204', and the voltage signal is output to the vertical signal line (column signal line) 208' provided on a column basis through the floating diffusion amplifier.

The column circuits 103' connected to the vertical signal lines (column signal lines) 208' are each implemented e.g. by a CDS (correlated double sampling) circuit and a gain amplifier. Further, the column circuits 103' are formed by respective circuits each having the same configuration on a column basis. A signal processed by the column circuit 103' is held in an associated one of the column memories 104'. The signal held in the column memory 104' is transferred to the output circuit 107' through the output signal line 106'. The output circuit 107' performs amplification, impedance conversion, and so forth on the input signal, and outputs the processed signal to the outside of the image pickup device.

However, in the technique described in Japanese Patent Laid-Open Publication No. 2008-211220, chips are connected via the floating diffusions in each of which the signal is faint among all signals within the pixel, and hence variation in the manufacturing of products of the FD results in variation in the capacity value of the FD, which causes PRNU (photo response non-uniformity) and DSNU (dark signal non-uniformity). Further, although the layout and position of a readout circuit is not described in Japanese Patent Laid-Open Publication No. 2008-211220, it is desirable to more efficiently lay out and position the reading circuit than the prior art, since the pixel section and the peripheral circuit section are formed on separate chips. Further, recently, a circuit which realizes a plurality of functions has come to be introduced into the peripheral circuits, as in the case where an analog-to-digital converter is introduced into the column circuit, on a column basis, and hence the chip areas of the peripheral circuits are increased. This brings about not only a problem that heat generated in the peripheral circuits generates dark current in the PD 202' in each pixel, but also a problem that the dark current becomes non-uniform in a screen-associated region if the peripheral circuits are biased in arrangement.

SUMMARY OF THE INVENTION

The present invention provides an image pickup device which suppresses an increase in chip area of peripheral circuits without degrading the performance of a pixel section and makes it possible to prevent costs from being increased, and an image pickup apparatus.

The present invention further provides an image pickup device which has a pixel section and a peripheral circuit section formed in different areas, wherein an increase in chip area is suppressed by efficiently arranging peripheral circuits without degrading the performance of the pixel section, and non-uniformity of dark current within a screen-associated region due to heat generated in the peripheral circuits is suppressed, and an image pickup apparatus.

In a first aspect of the present invention, there is provided an image pickup device comprising a first semiconductor substrate and a second semiconductor substrate, a pixel section including photoelectric conversion elements each configured to generate electric charges by photoelectric conversion, floating diffusions each configured to temporarily store the electric charges generated in one of the photoelectric conversion elements, and amplifiers each configured to output signals dependent on potentials of the one of the floating diffusions, a plurality of column signal lines configured to have the signals output thereto from the pixel section, on a column basis, and a plurality of column circuits connected to the plurality of column signal lines, respectively, and configured to perform predetermined processing on the signals output to the column signal lines, wherein the pixel section is formed on an area of the first semiconductor substrate and the plurality of column circuits are formed on an area of the second semiconductor substrate such that the plurality of column circuits are located under the pixel section in an overlapping manner when the image pickup device is viewed from a side where light enters.

In a second aspect of the present invention, there is provided an image pickup apparatus comprising this image pickup device.

In a third aspect of the present invention, there is provided an image pickup device comprising a semiconductor substrate including a first side and a second side, a pixel section including photoelectric conversion elements each configured to generate electric charges by photoelectric conversion, floating diffusions each configured to temporarily store the electric charges generated in one of the photoelectric conversion elements, and amplifiers each configured to output signals dependent on potentials of one of the floating diffusions, a plurality of column signal lines configured to have the signals output thereto from the pixel section, on a column basis, and a plurality of column circuits connected to the plurality of column signal lines, respectively, and configured to perform predetermined processing on the signals output to the column signal lines, wherein the pixel section is formed on the first side of the semiconductor substrate and the plurality of column circuits are formed on the second side of the semiconductor substrate such that the plurality of column circuits are located under the pixel section in an overlapping manner when the image pickup device is viewed from a side where light enters.

In a fourth aspect of the present invention, there is provided an image pickup apparatus comprising this image pickup device.

According to the above-described aspects of the present invention, it is possible to obtain an advantageous effect that it is possible to prevent costs from being increased due to an increase in chip area of the peripheral circuits without degrading the performance of the pixel section.

According to the above-described aspects of the present invention, it is possible to efficiently arrange the peripheral circuits without degrading the performance of the pixel section, and it is possible to reduce non-uniformity of dark current within a screen-associated region due to heat generated in the peripheral circuits.

Further features of the present invention will become apparent from the following description of exemplary embodiments with reference to the attached drawings.

BRIEF DESCRIPTION OF THE DRAWINGS

FIG. 21 is a diagram of another variation of the overall configuration of the image pickup device according to the sixth embodiment, as viewed from above.

FIG. 24 is a diagram of the overall configuration of an image pickup device according to a ninth embodiment of the present invention, as viewed from above.

FIG. 26 is a diagram of another variation of the overall configuration of the image pickup device according to the ninth embodiment, as viewed from above.

DESCRIPTION OF THE EMBODIMENTS

The present invention will now be described in detail below with reference to the accompanying drawings showing embodiments thereof.

Figure 1:
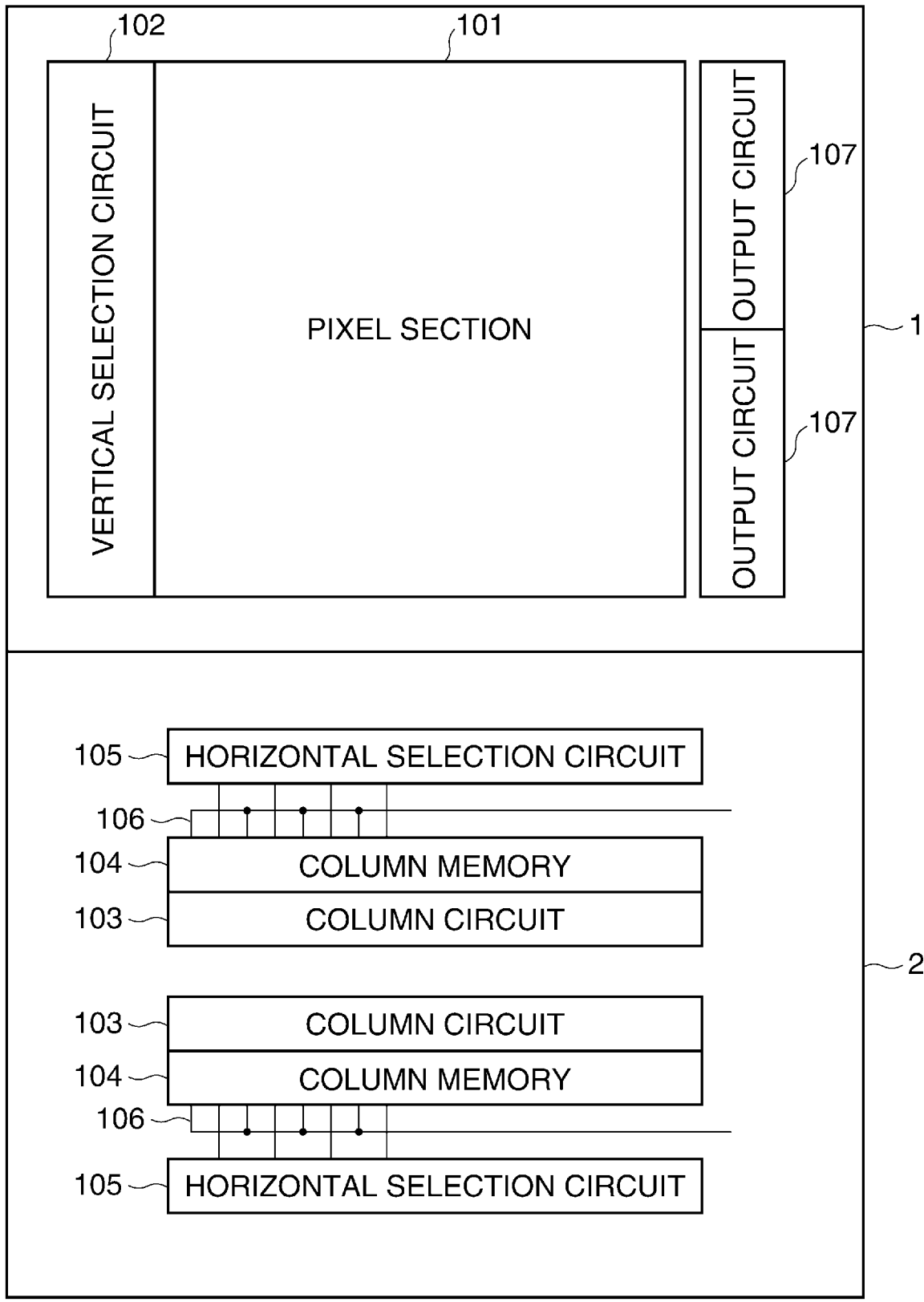
FIG. 1 is a block diagram useful in explaining the overall configuration of an image pickup device according to a first embodiment of the present invention.

FIG. 1 is a block diagram useful in explaining the overall configuration of an image pickup device according to a first embodiment of the present invention. It is assumed that in actuality, illustrated areas 1 and 2 overlap in a vertical direction.

Figure 10:
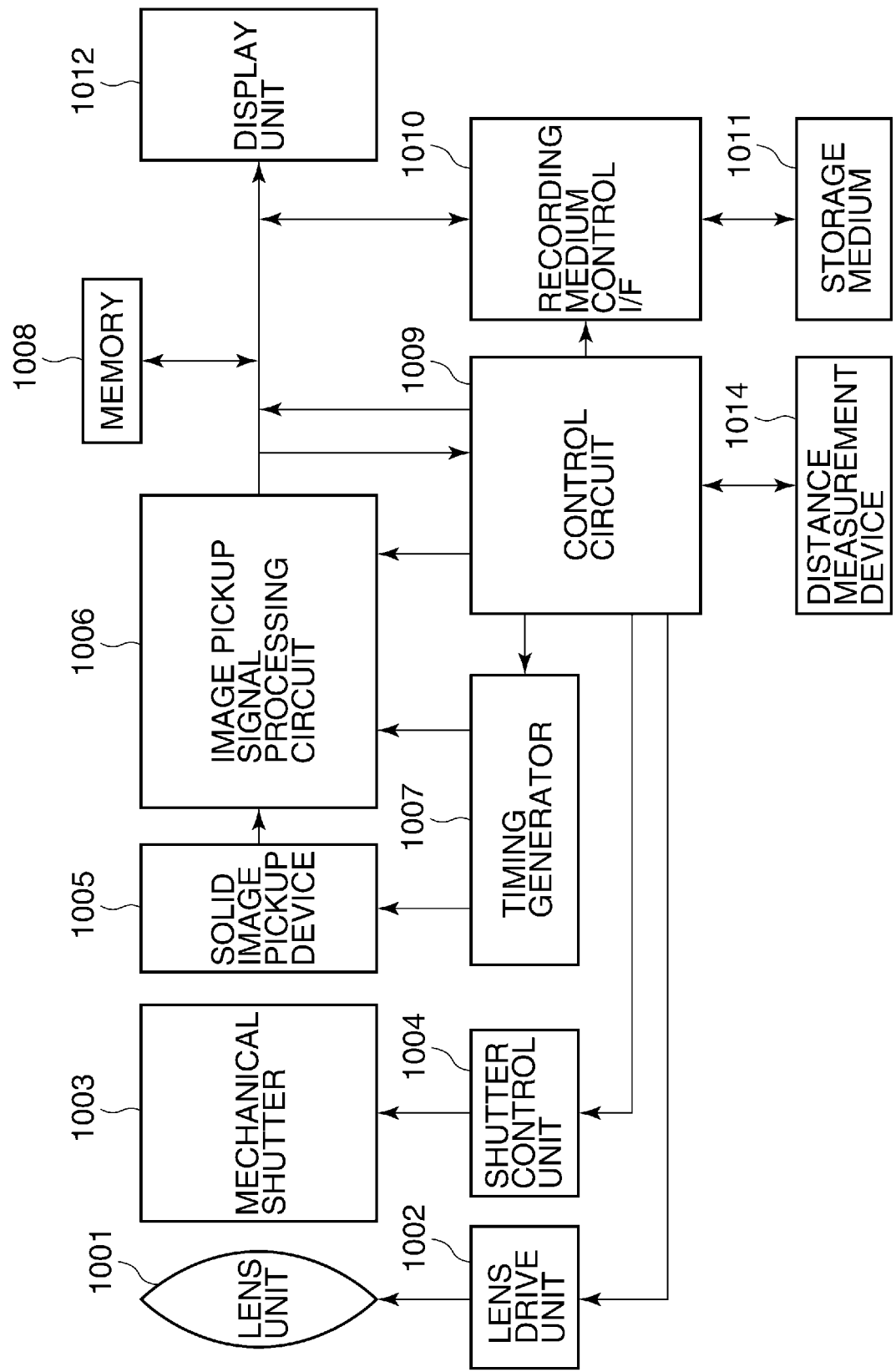
FIG. 10 is a schematic diagram of a digital camera as an example of an image pickup apparatus equipped with the image pickup device according to any of the first and second embodiments and variations thereof.

In FIG. 1, the image pickup device includes a pixel section 101, a vertical selection circuit 102 which selects at least one of rows of pixels in the pixel section 101, and column circuits 103 each of which reads out signals from pixels on a pixel row in the pixel section 101 selected by the vertical selection circuit 102, and performs predetermined processing on the read signals. The image pickup device further includes column memories 104 each of which holds signals processed by the column circuits 103, on a column basis, horizontal selection circuits 105 each of which selects a signal held in the associated column memory 104, and output signal lines 106 each of which reads out signals from a column selected by the horizontal selection circuit 105 to an associated one of output circuits 107. Note that the image pickup device may further incorporate not only illustrated components but also a timing generator 1007, referred to hereinafter, which supplies a timing signal to each of the vertical selection circuit 102, the horizontal selection circuits 105, the column circuits 103, etc., a control circuit 1009, referred to hereinafter, a digital-to-analog converter, and so forth. However, these components are not necessarily required to be provided on the same chip as the image pickup device, but the timing generator 1007 and the control circuit 1009 may be provided separately from the image pickup device, as shown in FIG. 10.

The vertical selection circuit 102 sequentially selects a plurality of rows in the pixel section 101, and outputs signals from a selected row to the column memories 104 via the column circuits 103. Each horizontal selection circuits 105 sequentially selects signals held in the associated column memory 104, and outputs the selected signals to the associated output circuit 107 via the associated output signal line 106. The pixel section 101 is formed by arranging a plurality of pixels in a two-dimensional array to provide a two-dimensional image.

The pixel section 101, the vertical selection circuit 102, and the output circuits 107, which are included in the area 1, are formed on a first semiconductor substrate. On the other hand, the column circuits 103, the column memories 104, the horizontal selection circuits 105, and the output signal lines 106, which are included in the area 2, are formed on a second semiconductor substrate. The first semiconductor substrate and the second semiconductor substrate are separately formed, and are laminated while providing interconnections requiring electrical connection, whereby both the substrates are mounted in the same package. That is, as viewed from an upper surface of the image pickup device package (from a side of the pixel section 101 where light enters), the column circuits 103, the column memories 104, the horizontal selection circuits 105, and the output signal lines 106, which are formed on the area 2 on the second semiconductor substrate, are disposed under the pixel section 101 formed on the area 1 on the first semiconductor substrate, in an overlapping manner. By disposing the timing generator 1007, the control circuit 1009, the digital-to-analog converter, etc. in the area 2 under the vertical selection circuit 102 and the output circuits 107 in the area 1, a high area efficiency is achieved. Note that although in a plurality of embodiments described hereinafter, the arrangement including the first semiconductor substrate and the second semiconductor substrate will be described by way of example, this is not limitative, but the arrangement may include still another semiconductor substrate.

Figure 2:
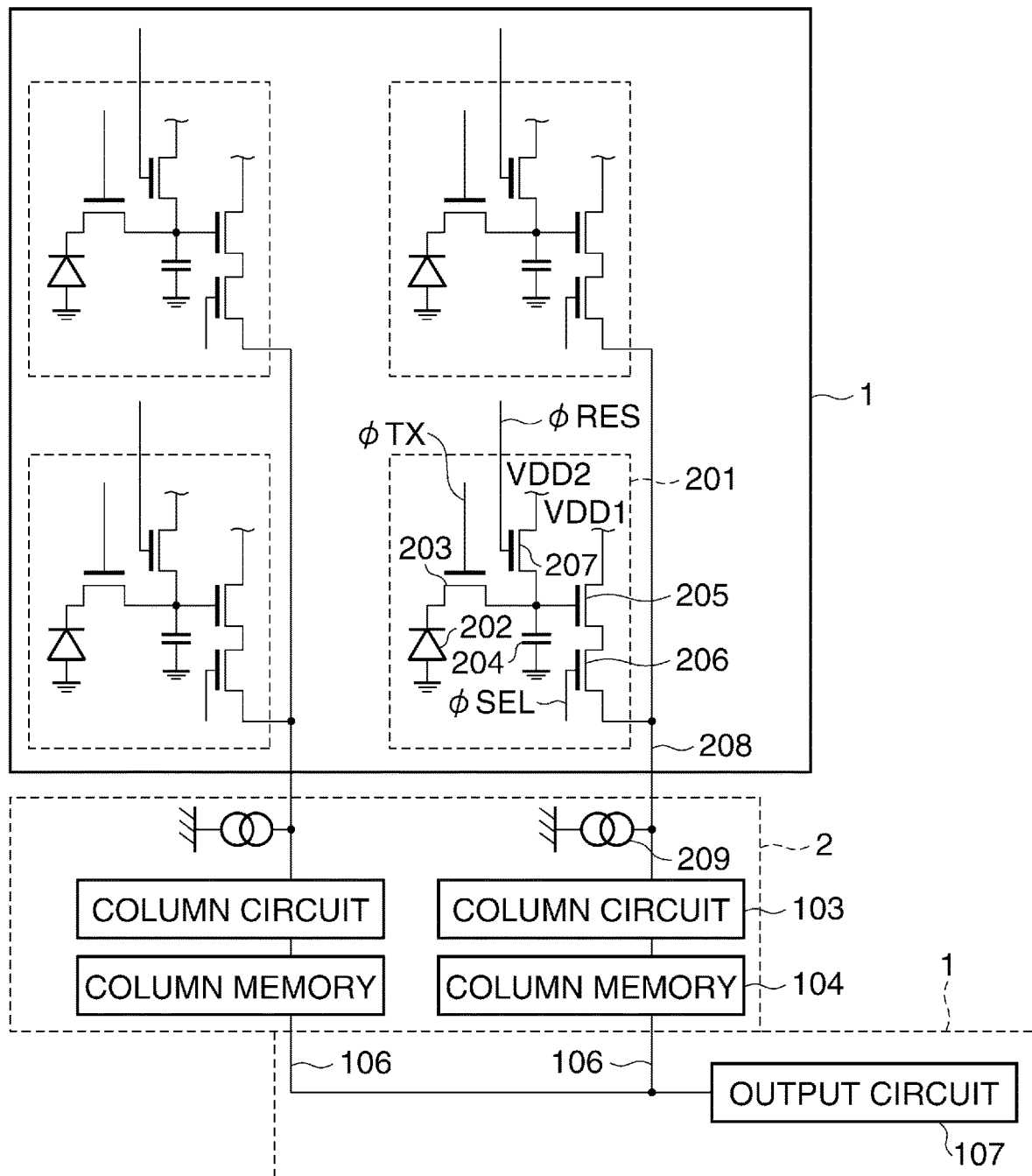
FIG. 2 is a diagram showing pixels and the circuit configuration for reading out signals from the pixels, in the image pickup device according to the first embodiment.

FIG. 2 is a diagram showing a pixel and the circuit configuration for reading out a signal from the pixel in the image pickup device according to the first embodiment.

As shown in FIG. 2, a pixel array which provides a two-dimensional image is formed by arranging a plurality of pixels in a two-dimensional array. Each pixel 201 is configured to include a photo diode (hereinafter also referred to as the "PD") 202, a transfer switch 203, a floating diffusion (hereinafter also referred to as the "FD") 204, a reset switch 207, a MOS amplifier 205, and a selection switch 206.

The PD 202 functions as a photoelectric conversion element which converts light incident through an optical system to an electric signal by photoelectric conversion to thereby generate electric charges. The anode of the PD 202 is connected to a ground line, and the cathode of the PD 202 is connected to the source of the transfer switch 203. The transfer switch 203 is driven by a transfer pulse φTX input to a gate terminal thereof to transfer the electric charges generated in the PD 202 to the FD 204. The FD 204 functions as a charge-voltage converting section which temporarily accumulates electric charges, and converts the accumulated electric charges to a voltage signal.

The MOS amplifier 205 is implemented by an amplification circuit, such as a MOSFET, functions as a source follower, and has a gate to which the voltage signal converted from the electric charges in the FD 204 is input. Further, the MOS amplifier 205 has a drain connected to a first power line VDD1 for supplying a first potential thereto, and a source connected to the selection switch 206. The selection switch 206 is driven by a vertical selection pulse φSEL input to a gate thereof, and has a drain connected to the MOS amplifier 205, and a source connected to a vertical signal line 208. When the vertical selection pulse φSEL becomes an active level (high level), the selection switch 206 of each pixel belonging to the corresponding row on the pixel array becomes conductive, whereby the source of the MOS amplifier 205 is connected to the vertical signal line 208.

The reset switch 207 has a drain connected to a second power line VDD2 for supplying a second potential (reset potential) as a constant potential, and a source connected to the FD 204. Further, the reset switch 207 is driven by a reset pulse φRES input to a gate thereof to remove the electric charges accumulated in the FD 204. The pulses φTX, φSEL, and φRES are supplied from the vertical selection circuit 102.

A floating diffusion amplifier is formed by not only the FD 204 and the MOS amplifier 205, but also a constant current source 209 for supplying a constant current to the vertical signal line 208. In each of pixels forming the row selected by the selection switch 206, the electric charges transferred from the PD 202 to the FD 204 is converted to the voltage signal, and the voltage signal is output to the vertical signal line (column signal line) 208 provided on a column basis through the floating diffusion amplifier.

The column circuits 103 connected to the vertical signal lines (column signal lines) 208 are each implemented e.g. by a CDS (correlated double sampling) circuit and a gain amplifier. The CDS circuit performs correlated double sampling processing on a signal output to the vertical signal line 208. The gain amplifier amplifies a signal output to the vertical signal line 208 with a predetermined gain. Further, the column circuits 103 are formed by respective circuits each having the same configuration on a column basis. A signal subjected to the above-mentioned processing by the column circuit 103 is held by an associated one of the column memories 104. The signal held by the column memory 104 is transferred to the output circuit 107 through the output signal line 106. The output circuit 107 performs amplification, impedance conversion, etc., on the input signal, and outputs the processed signal to the outside of the image pickup device.

Although the column circuit 103, the column memory 104, and the output circuit 107 can be configured to have the above-described circuit configuration, the column circuit 103 may be configured to have an analog-to-digital converter on a column basis. In this case, the column circuit 103 includes an analog-to-digital converter in addition to the CDS circuit and the gain amplifier. Further, each column memory 104 in this case is a digital memory, and each output circuit 107 is provided with components including an LVDS (low voltage differential signaling) driver.

The illustrated area 1, i.e. the first semiconductor substrate is configured to include the PD 202, the transfer switch 203, the FD 204, the reset switch 207, the MOS amplifier 205, and the selection switch 206, provided on a pixel basis, and the output circuits 107.

The illustrated area 2, i.e. the second semiconductor substrate is configured to include the vertical signal lines 208, the constant current sources 209, the column circuits 103, the column memories 104, and the output signal lines 106, provided on a column basis. The vertical signal lines (column signal lines) 208 are interconnections connecting between the pixel section 101 and the column circuits 103, and may be included in either the area 1 or the area 2. Further, each selection switch 206 may be included in the area 2.

Figure 3:
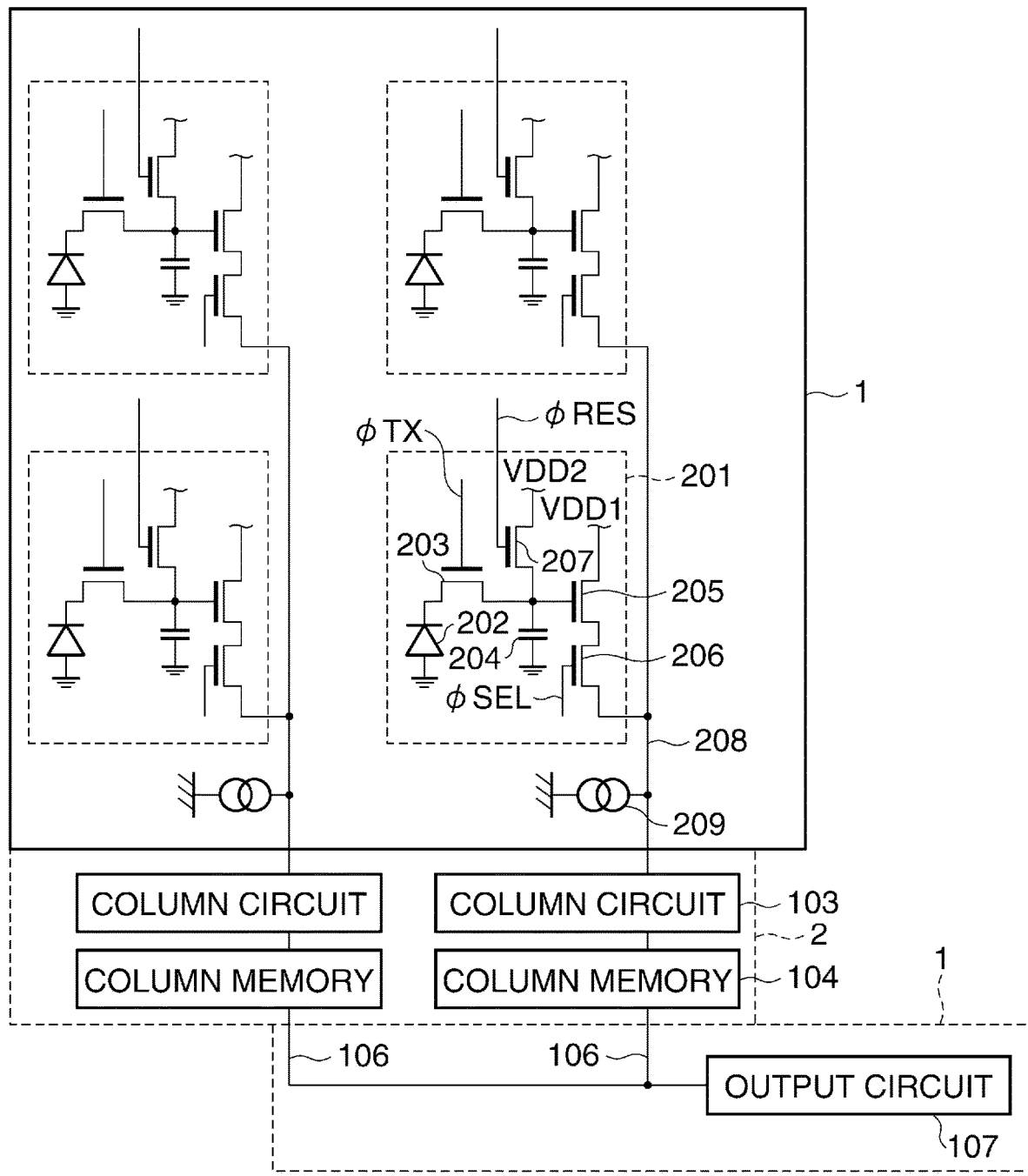
FIG. 3 is a diagram showing a variation of the circuit configuration shown in FIG. 2.

Further, as in a variation of the circuit configuration shown in FIG. 3, the constant current source 209 may be included in the area 1. However, in this case, the constant current source 209 is disposed on the same board as that on which the pixels are disposed, and hence the area efficiency is not very high. This arrangement is effective only in a case where an area for arranging the column circuit 103, the column memory 104, and the output signal line 106 is larger than the area of the pixel section.

Figure 4:
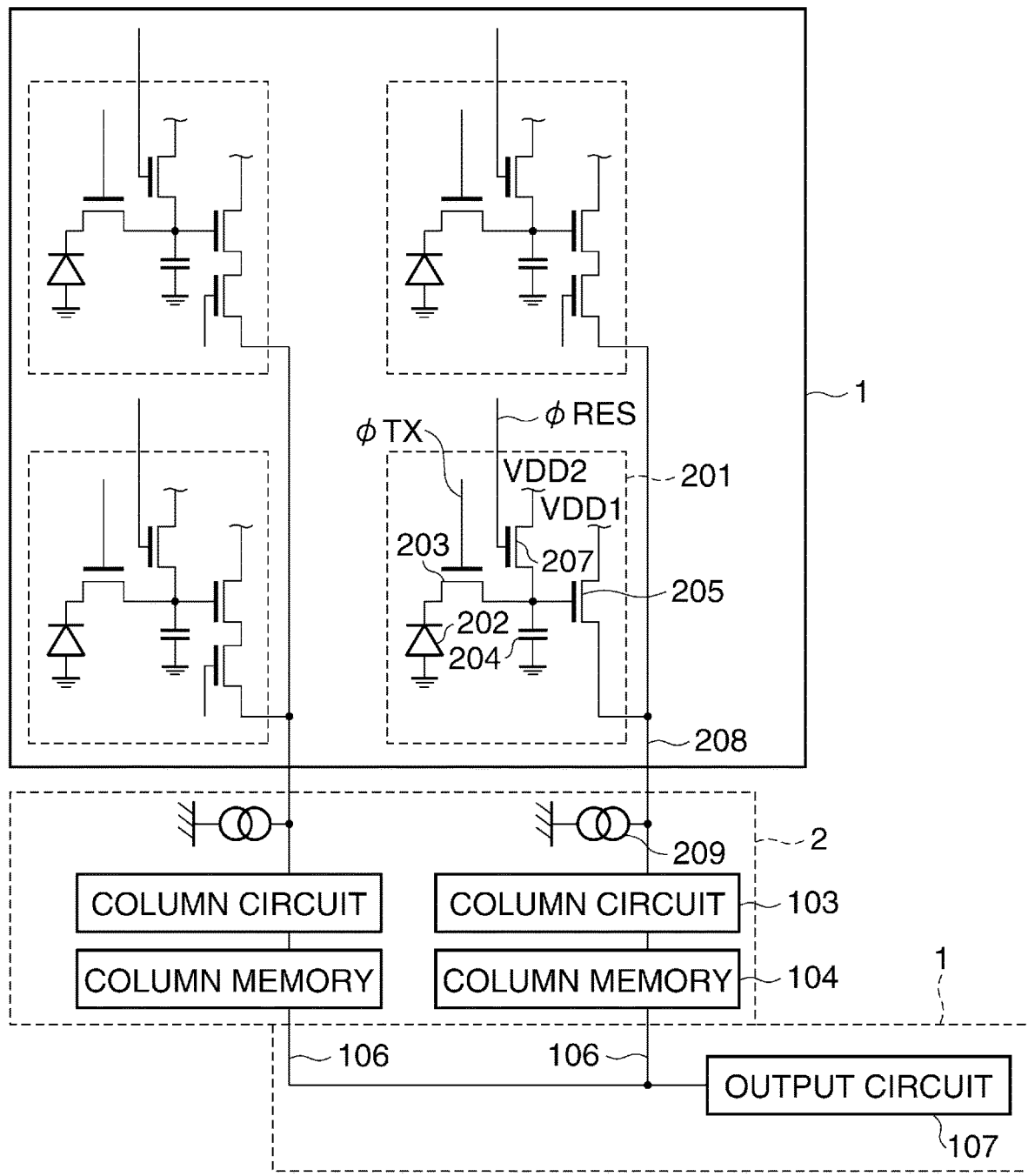
FIG. 4 is a diagram showing another variation of the circuit configuration shown in FIG. 2.

Further, as in another variation of the circuit configuration shown in FIG. 4, the selection switch 206 may be omitted. In the circuit configuration without the selection switch 206, each selected row and each non-selected row are set by controlling the reset pulse φRES and the potential of the second power line VDD2.

Figure 5:
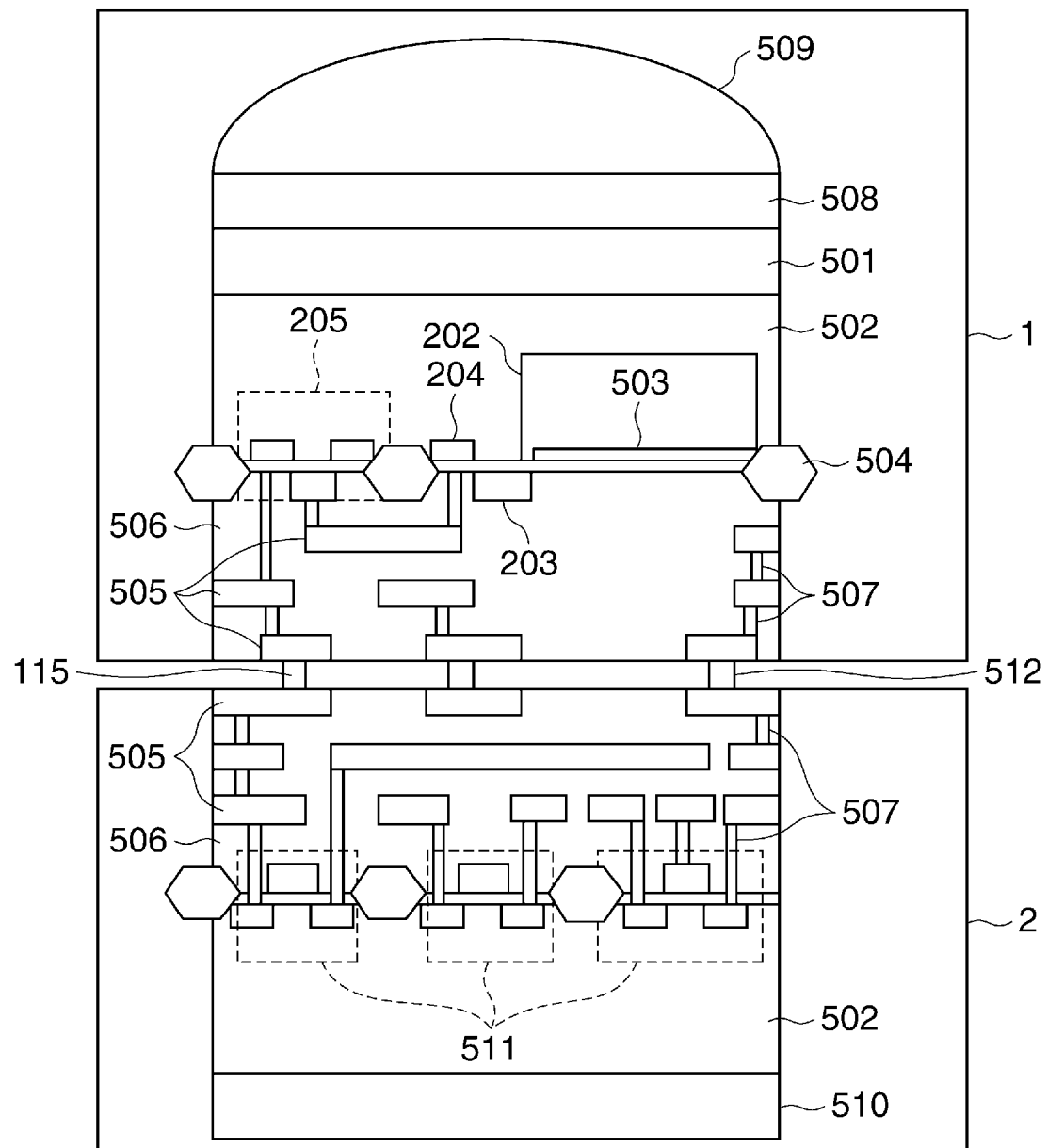
FIG. 5 is a view showing a cross-sectional structure of the image pickup device according to the first embodiment.

FIG. 5 is a view showing a cross-sectional structure of the image pickup device according to the first embodiment of the present invention. FIG. 5 shows the structure in which the area 1 as the first semiconductor substrate is laminated on the area 2 as the second semiconductor substrate. The same components as those shown in FIG. 2 are denoted by the same reference numerals.

The area 1 indicating the first semiconductor substrate is formed on a semiconductor substrate 501. The area 1 includes a region 502 of a first conductivity type, a region 202 of the PDs, and a region 503 of the first conductivity type for reducing dark current of the PDs 202. The area 1 further includes the transfer switches 203, the FDs 204, and the MOS amplifiers 205. In addition to these, the area 1 includes the reset switches 207.

The area 1 further includes an element isolation region 504, a interconnection layer 505 formed in a multilayered manner, and an interlayer film 506 between the multiple layers of the interconnection layer 505. A through hole 507 electrically connects between the interconnections. Since the area 1 includes the pixel section, it also includes a color filter 508 for performing color separation, and a micro lens 509 for collecting light.

The area 2 indicating the second semiconductor substrate as a semiconductor substrate other than the first semiconductor substrate is formed on a semiconductor substrate 510. Each circuit of the column circuit 103 is formed by a plurality of types of switches in each of switch type groups 511. The area 2 further includes the column memories 104, the output signal lines 106, and so on. Connection points 115 of the vertical signal lines 208 are formed e.g. by micro bumps which electrically connect between the area 1 and the area 2. Further, in addition to the connection points 115 of the vertical signal lines 208, the area 2 includes connection points 512 formed e.g. by micro bumps which electrically connect interconnections for supplying power and various kinds of drive pulses. Although in the present embodiment, there is illustrated the first semiconductor substrate in which a light receiving section is formed by a back side illumination type, the light receiving section may be formed by a front side illumination type instead of the back side illumination type.

Figure 6:
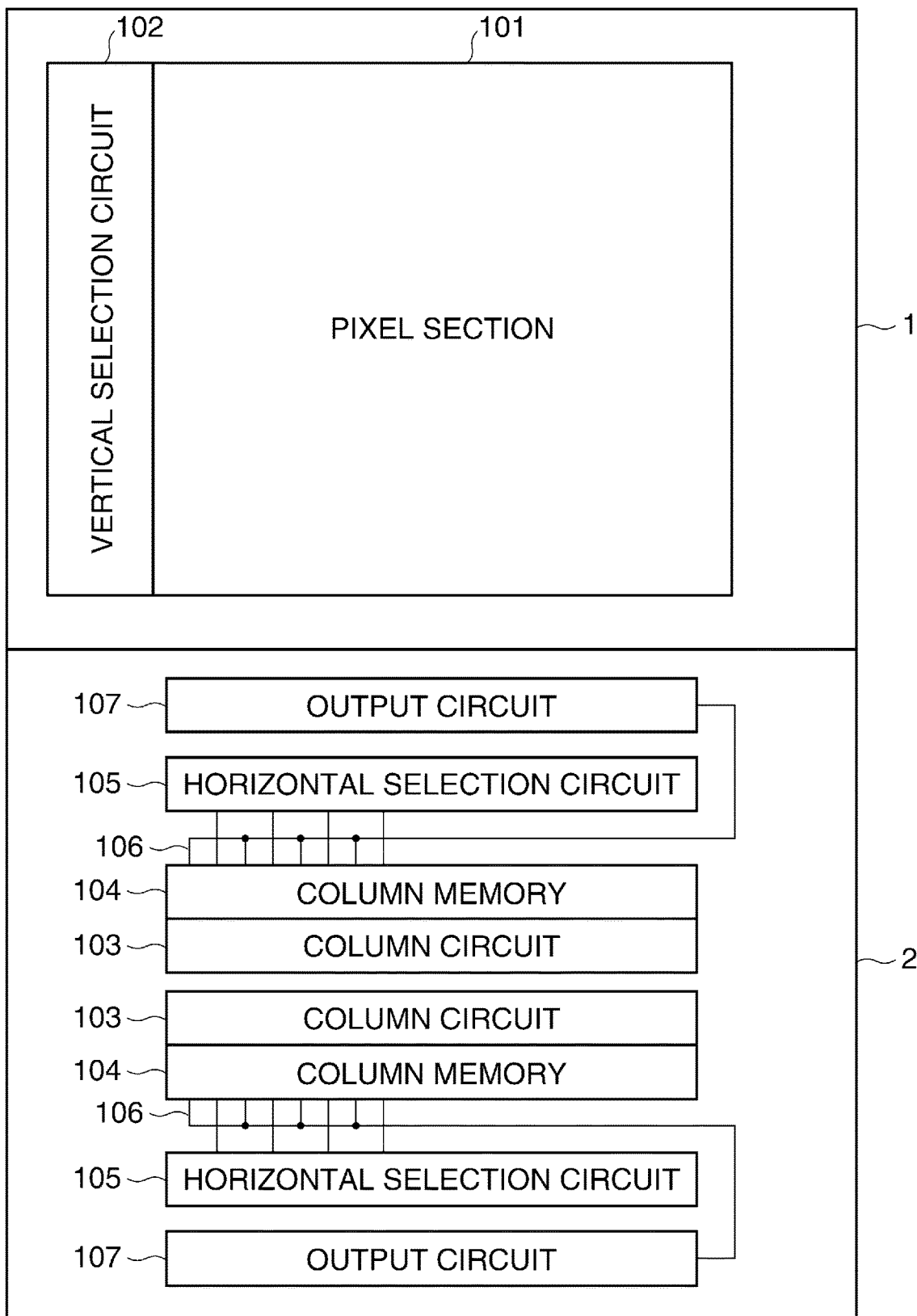
FIG. 6 is a block diagram showing a variation of the overall configuration of the image pickup device shown in FIG. 1.

Although in the present embodiment, the pixel section 101, the vertical selection circuit 102, and the output circuits 107 are formed in the area 1, and the other drive circuits are disposed in the area 2, this is not limitative. For example, as in a variation of the overall configuration of the image pickup device shown in FIG. 6, the output circuits 107 may be disposed in the area 2.

Figure 7:
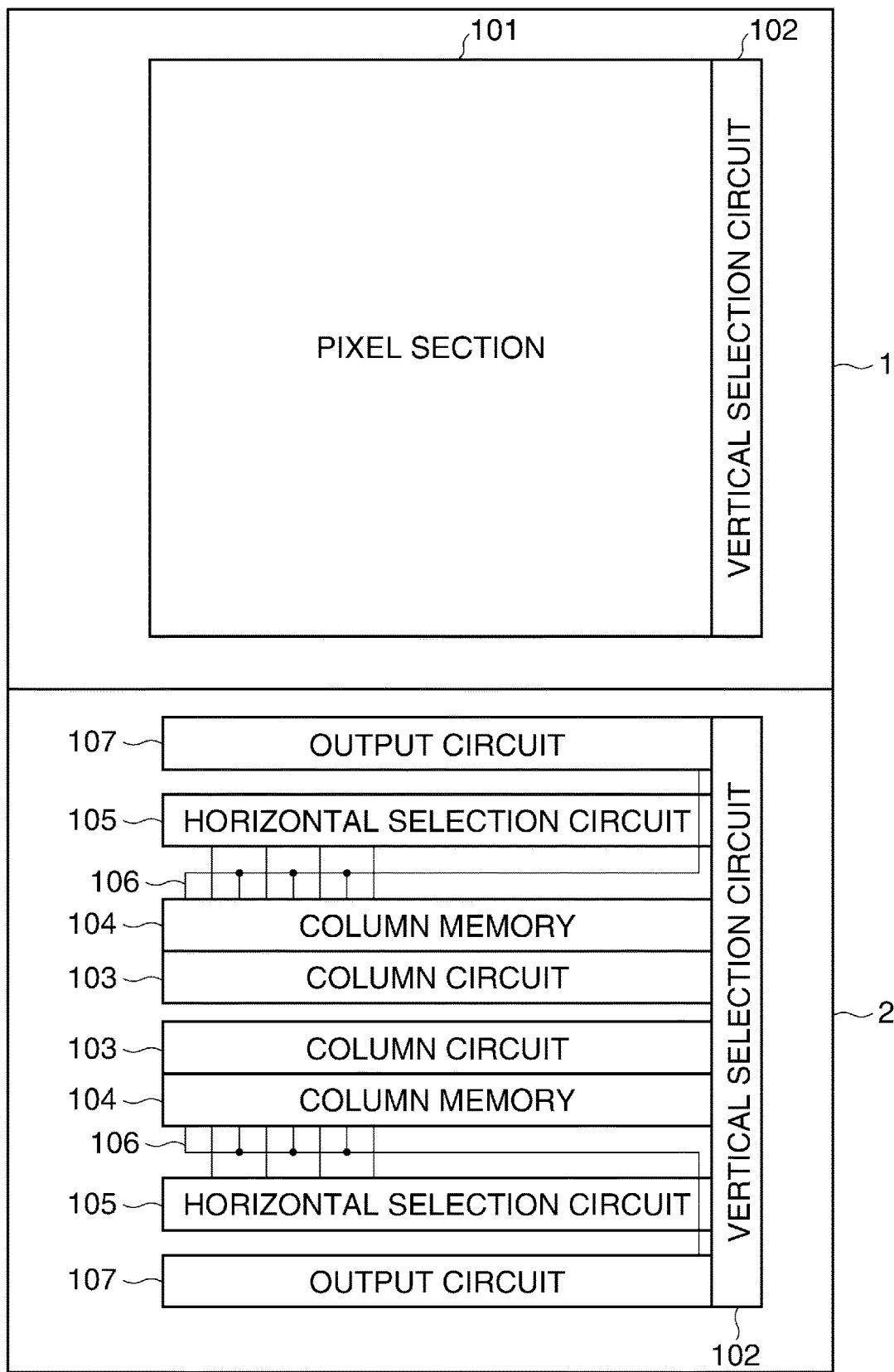
FIG. 7 is a block diagram showing another variation of the overall configuration of the image pickup device shown in FIG. 1.

Further, as in another variation of the overall configuration of the image pickup device shown in shown in FIG. 7, part of the vertical selection circuit 102 may be disposed in the area 1, and the rest of the vertical selection circuit 102 may be disposed in the area 2. Further, in this case, it is possible to improve the area efficiency by arranging the part and the rest of the vertical selection circuit 102 at approximately the same location, as viewed from above. That is, in the present invention, it is only required to arrange at least the transfer switches 203, the FDs 204, the reset switches 207, and the MOS amplifiers 205 of the pixel section 101 in the area 1 so as to prevent the FDs 204 from being divided between the area 1 and the area 2. The other drive circuits can be disposed in the area 1 or the area 2 depending on the area efficiency of the semiconductor substrate.

Figure 8:
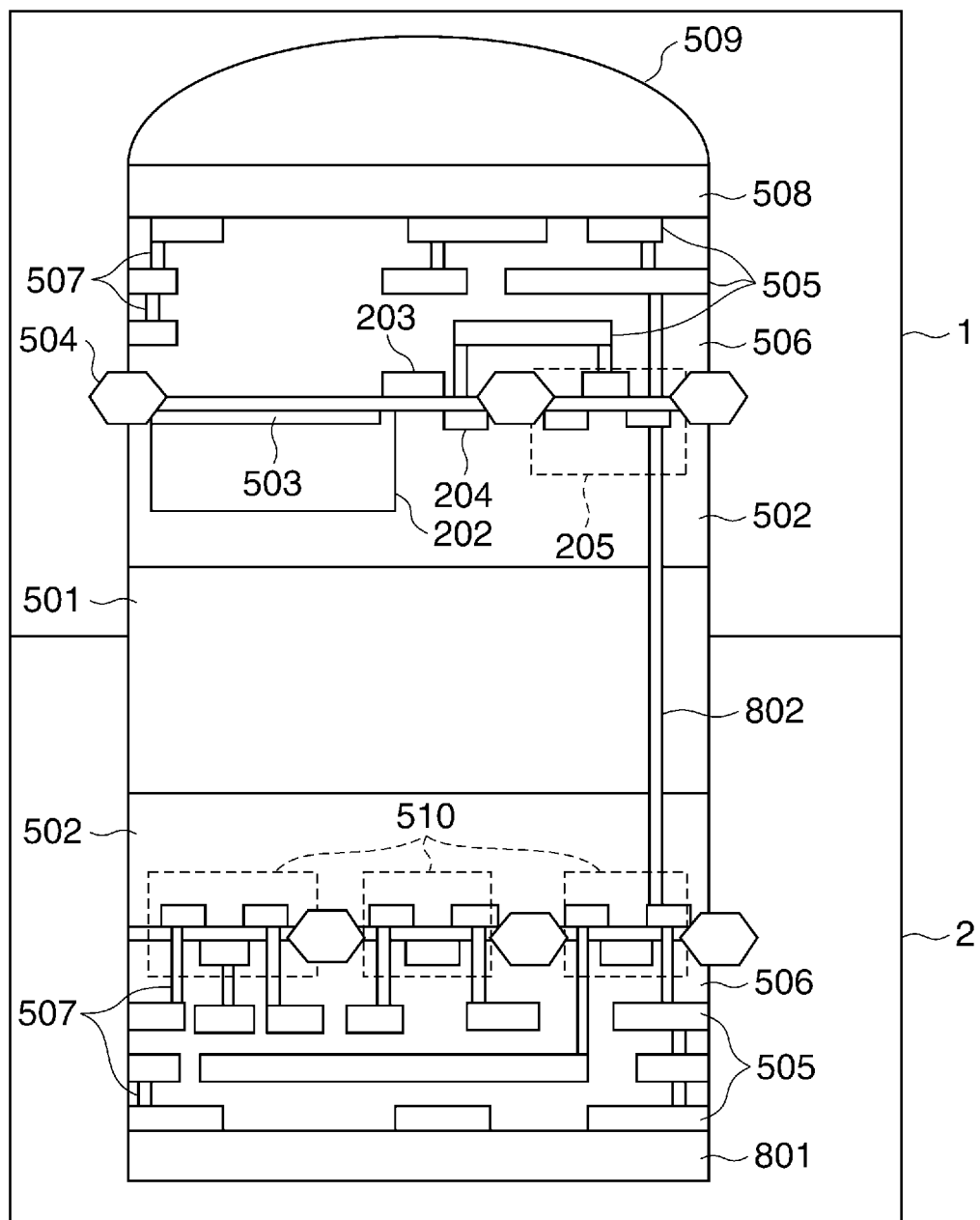
FIG. 8 is a view showing a cross-sectional structure of an image pickup device according to a second embodiment of the present invention.

Although in the above-described embodiment, as shown in FIG. 5, the area 1 is set on the first semiconductor substrate, and the area 2 is set on the second semiconductor substrate, this is not limitative, but the areas 1 and 2 may be formed on the same semiconductor substrate, as shown in FIG. 8.

FIG. 8 is a view showing a cross-sectional structure of an image pickup device according to a second embodiment of the present invention. The same components as those shown in FIGS. 2 and 5 are denoted by same reference numerals, and description thereof is omitted.

In the second embodiment shown in FIG. 8, the area 1 and the area 2 are formed on the front side (first side or second side) and the back side (first side or second side) of the semiconductor substrate 501, respectively. In the present embodiment, a description will be given assuming that a side on which the area 1 is formed is the front side, and a side on which the area 2 is formed is the back side. A protective layer 801 protects the interconnection layer 505 on the back side. Plugs 802 electrically connect between the front side and the back side.

Figure 9:
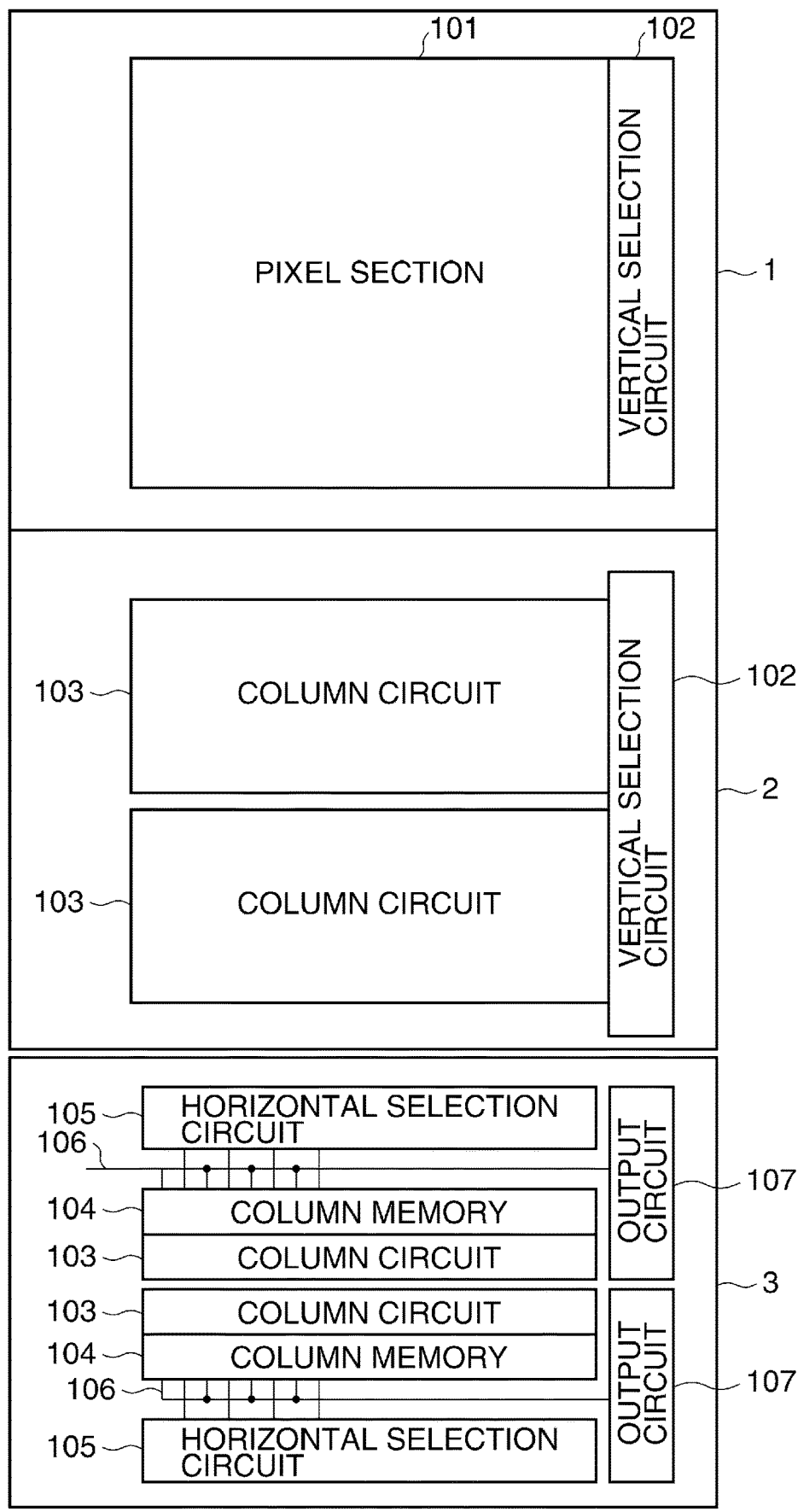
FIG. 9 is a block diagram showing still another variation of the overall configuration of the image pickup device shown in FIG. 1.

Further, although in the above-described embodiments, the description has been given of the area 1 and the area 2, the areas are not limited to two, but may be divided into a plurality of areas and have various components arranged thereon. For example, as in a variation shown in FIG. 9, the pixel section 101 and the vertical selection circuit 102 may be formed on the area 1, and the rest of the drive circuits may be formed in a manner divided between the areas 2 and 3. In the illustrated example, the rest of the vertical selection circuit 102 and the column circuits 103 are formed on the area 2, and the rest of the column circuits 103 and the other drive circuits are formed on the area 3, separately. As described above, by separately arranging the components across the plurality of areas, it is possible to mount an analog-to-digital converter and the like, on a column basis, and effectively arrange an increasing number of column circuits 103. Note that the areas 1, 2, and 3 may be formed on different semiconductor substrates, respectively.

FIG. 10 is a schematic diagram of a digital camera as an example of an image pickup apparatus equipped with the image pickup device according to any of the above-described embodiments and variations.

In FIG. 10, a lens unit 1001 which forms an optical image of an object into an image on a solid image pickup device (the image pickup device according to any of the above-described embodiments and variations) 1005 is driven by a lens drive unit 1002 so as to perform zoom control, focus control, aperture control, and so forth. A mechanical shutter 1003 is controlled by a shutter control unit 1004. The solid image pickup device 1005 converts an object image formed by the lens unit 1001 to an image signal, and outputs the image signal. An image pickup signal processing circuit 1006 performs various kinds of correction on an image signal output from the solid image pickup device 1005, and compresses data.

The timing generator 1007 is a drive unit which supplies various kinds of timing signals to the solid image pickup device 1005 and the image pickup signal processing circuit 1006. The control circuit 1009 controls various kinds of computations and the overall operation of the image pickup apparatus. A memory 1008 temporarily stores image data. An recording medium control interface 1010 records or reads out data in or from a removable storage medium 1011, such as a semiconductor memory. A display unit 1012 displays various information items and a shot image.

Next, a description will be given of the operation of the digital camera having the above-described arrangement during shooting.

When the main power, not shown, is switched on, the power of a control system turns on, and further, the power of image pickup system circuits, such as the image pickup signal processing circuit 1006, turns on. Subsequently, when a release button, not shown, is depressed, the control circuit 1009 extracts a high-frequency component based on a signal output from a distance measurement device 1014, and performs calculation of a distance to the object. Thereafter, the control circuit 1009 drives the lens unit 1001 by the lens drive unit 1002, and determines whether or not the object is in focus. If it is determined that the object is not in focus, the control circuit 1009 drives the lens unit 1001 again, and performs distance measurement. Then, when it is confirmed that the object is in focus, an image pickup operation is started.

When the image pickup operation is terminated, the image signal output from the solid image pickup device 1005 is subjected to image processing in the image signal processing circuit 1006, and is written into the memory 1008 by the control circuit 1009. The data accumulated in the memory 1008 is recorded in the removable storage medium 1011, such as a semiconductor memory, through the recording medium control interface 1010 by the control of the control circuit 1009. Note that the data may be directly input e.g. to a computer for image processing through an external interface section, not shown.

Figure 11:
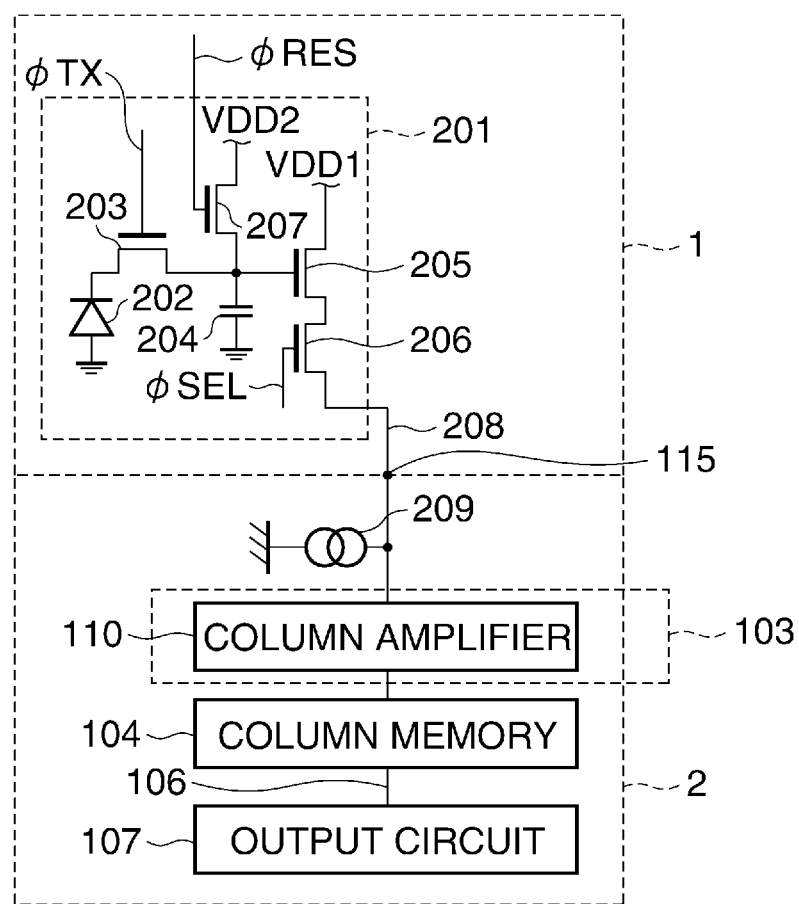
FIG. 11 is a diagram showing a configuration of a pixel and a circuit configuration for reading out a signal from the pixel, in an image pickup device according to a third embodiment of the present invention.

FIG. 11 is a diagram showing a configuration of a pixel and a circuit configuration for reading out a signal from the pixel, in an image pickup device according to a third embodiment of the present invention. The area 1 is a chip including circuits formed on the first semiconductor substrate, and the area 2 is a chip including circuits formed on the second semiconductor substrate.

The area 1 mainly includes the pixels 201, and the area 2 mainly includes the column circuit for processing a signal from each pixel 201.

The area 1 is formed by arranging a plurality of the pixels 201 in a two-dimensional array as a pixel array which provides a two-dimensional image. Each pixel 201 can be configured to include the photo diode (hereinafter also referred to as the "PD") 202, the transfer switch 203, the floating diffusion (hereinafter also referred to as the "FD") 204, the MOS amplifier 205, the selection switch 206, and the reset switch 207.

The PD 202 functions as a photoelectric conversion section which converts light incident through an optical system to an electric signal by photoelectric conversion to thereby generate electric charges. The anode of the PD 202 is connected to a ground line, and the cathode of the PD 202 is connected to a source of the transfer switch 203. The transfer switch 203 is driven by a transfer pulse $\phi TX$ input to a gate terminal thereof to transfer the electric charges generated in the PD 202 to the FD 204. The FD 204 functions as a charge-voltage converting section which temporarily accumulates electric charges, and converts the accumulated electric charges to a voltage signal.

The MOS amplifier 205 functions as a source follower, and has a gate to which the voltage signal converted from the electric charges in the FD 204 is input. Further, the MOS amplifier 205 has a drain connected to the first power line VDD1 for supplying a first potential thereto, and a source connected to the selection switch 206. The selection switch 206 is driven by a vertical selection pulse $\phi SEL$ input to a gate thereof, and has a drain connected to the MOS amplifier 205, and a source connected to the vertical signal line 208. When the vertical selection pulse $\phi SEL$ becomes an active level (high level), the selection switch 206 of each pixel belonging to the corresponding row on the pixel array becomes conductive, whereby the source of the MOS amplifier 205 is connected to the vertical signal line 208. The vertical signal line 208 is shared by a plurality of pixels 201 sharing a column.

The reset switch 207 has a drain connected to the second power line VDD2 for supplying a second potential (reset potential), and a source connected to the FD 204, and is driven by a reset pulse $\phi RES$ input to the gate thereof to remove electric charges accumulated in the FD 204.

A floating diffusion amplifier is formed by not only the FD 204 and the MOS amplifier 205, but also the constant current source 209 for supplying a constant current to the vertical signal line 208. In each of pixels forming the row selected by the selection switch 206, the electric charges transferred from the PD 202 to the FD 204 is converted to the voltage signal by the FD 204, and the voltage signal is output to the vertical signal line (column signal line) 208 provided on a column basis through the floating diffusion amplifier. The pulses $\phi TX$, $\phi SEL$, and $\phi RES$ are supplied from the vertical selection circuit, referred to hereinafter.

The column circuit 103 connected to each of the vertical signal lines (column signal line) 208 is implemented e.g. by a column amplifier 110. The column circuits 103 are formed by respective circuits each having the same configuration on a column basis. The column circuit 103 may have the configuration including only the column amplifier 110 appearing in FIG. 11, or may have a configuration including a CDS (correlated double sampling) circuit.

A signal subjected to the above-mentioned processing by the column circuit 103 is held by an associated one of the column memories 104. The signal held by the column memory 104 is transferred to the output circuit 107 through the output signal line 106. The output circuit 107 performs amplification, impedance conversion, etc., on the input signal, and outputs the processed signal to the outside of the image pickup device.

The area 1 and the area 2 are electrically connected via the connection points 115 of the vertical signal lines (column signal lines) 208. Each connection points 115 is disposed downstream of the MOS amplifier 205 as shown in FIG. 11, whereby it is possible to reduce PRNU (photo response non-uniformity) and DSNU (dark signal non-uniformity). The constant current source 209 may be disposed in the area 2 or in the area 1.

Figure 12:
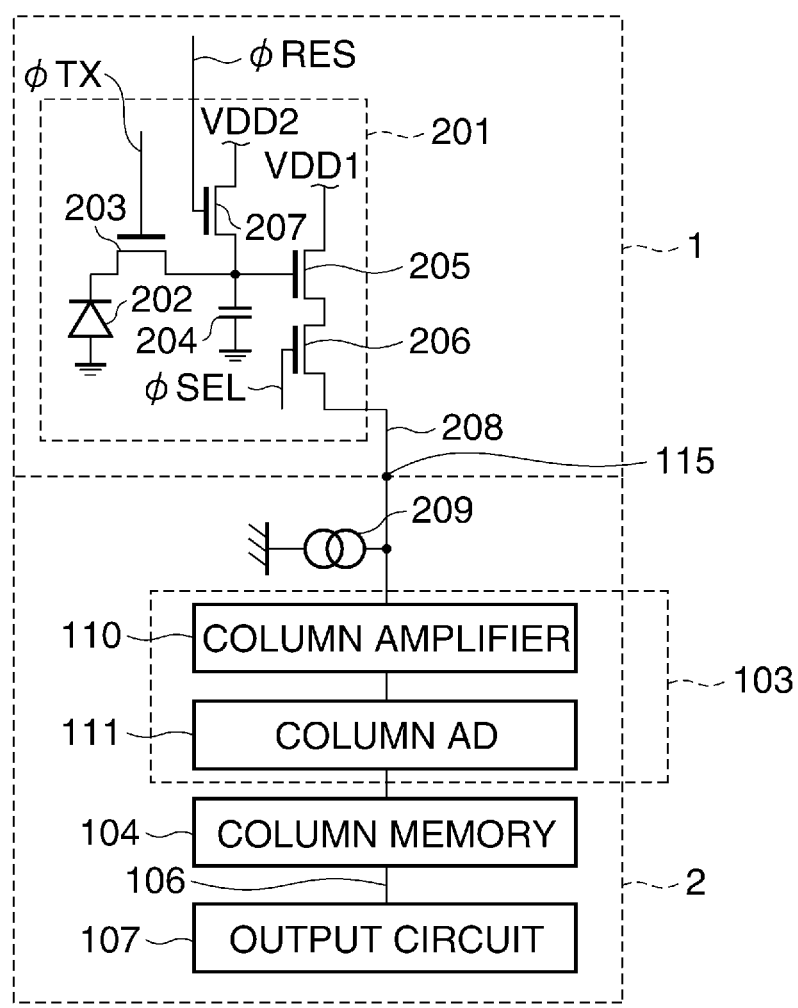
FIG. 12 is a diagram showing a variation of the circuit configuration of the image pickup device shown in FIG. 11.

FIG. 12 is a diagram showing a variation of the circuit configuration of the image pickup device shown in FIG. 11.

In FIG. 12, a column AD 111 is mounted at a location downstream of the column amplifier 110. The column AD 111 is an analog-to-digital converter provided on a column basis, which performs analog-to-digital conversion. In this case, the column circuit 103 is formed by the column amplifier 110 and the column AD 111. The column circuit 103 may further include the above-mentioned CDS circuit, etc. In the case of the configuration including the column AD 111, the column memory 104 is a digital memory, and the output circuit 107 is provided with components including an LVDS (low voltage differential signaling) driver.

Figure 13:
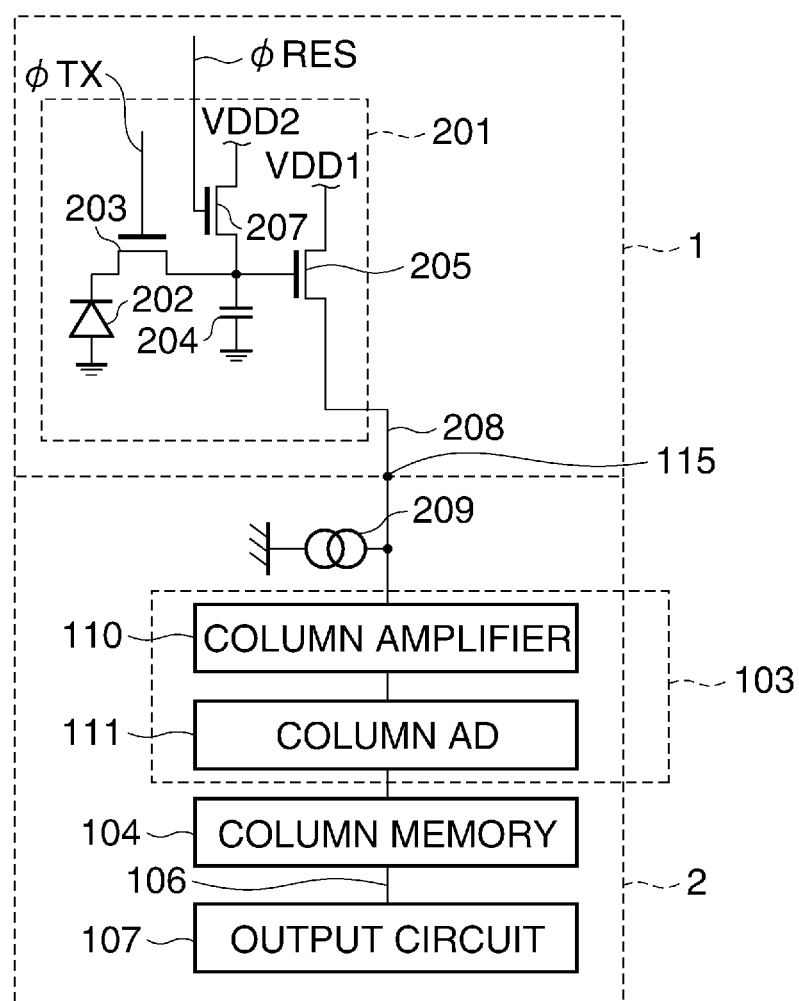
FIG. 13 is a diagram showing another variation of the circuit configuration of the image pickup device shown in FIG. 11.

Further, as shown in another variation shown in FIG. 13, the circuit configuration may exclude the selection switch 206.

Figure 14:
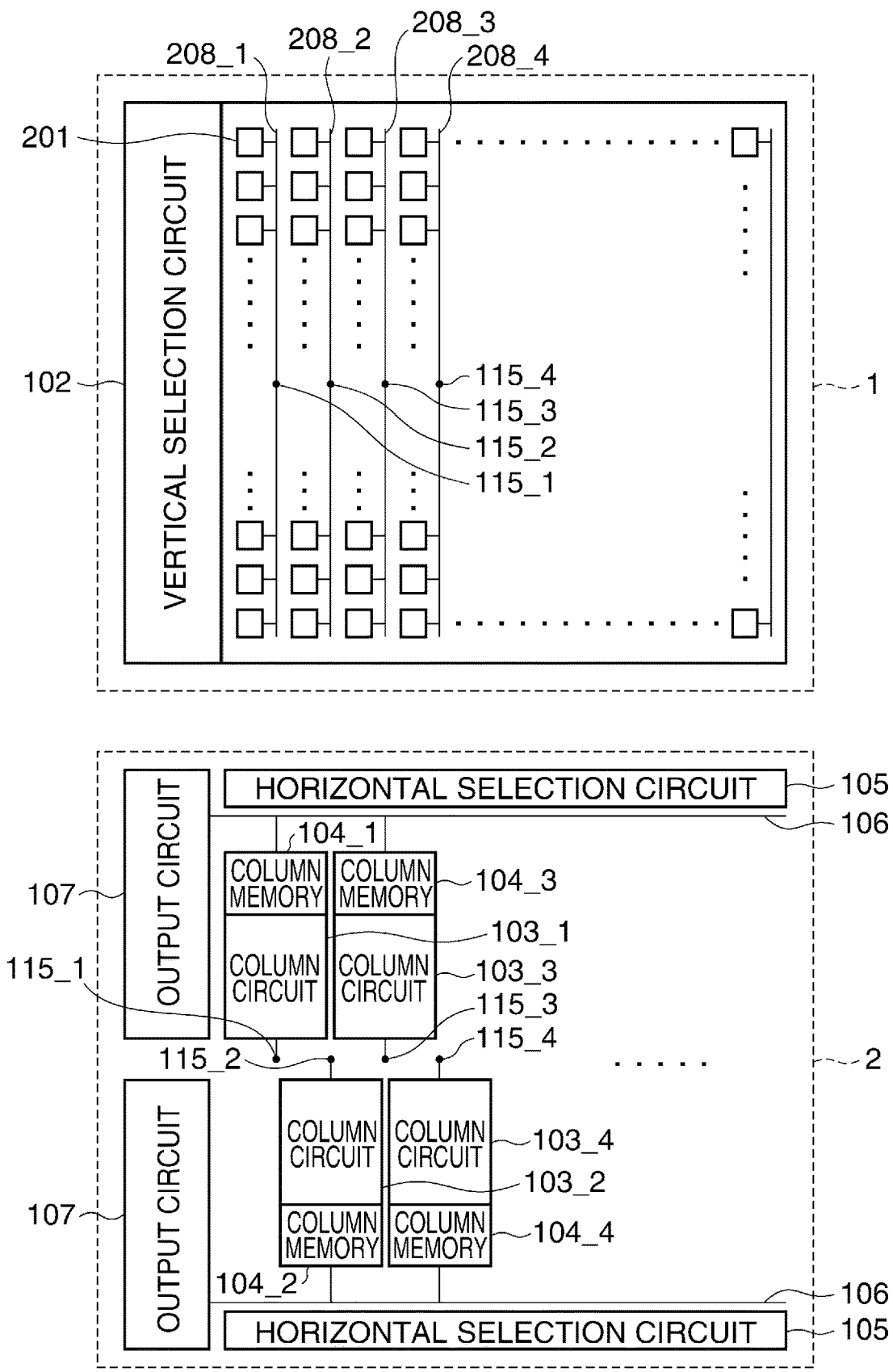
FIG. 14 is a diagram of the overall configuration of the image pickup device according to the third embodiment, as viewed from above.

FIG. 14 is a schematic diagram of the image pickup device according to the third embodiment, as viewed from above. The area 1 and the area 2 are chips formed on different semiconductor substrates, respectively, and are mounted on the same package by providing interconnections requiring electrical connection. That is, as viewed from an upper surface of the package, the area 2 is disposed under the area 1, in an overlapping manner.

The area 1 has the pixels 201 formed on a plurality of rows and columns in an array. The above-mentioned pulses $\phi TX$, $\phi SEL$, and $\phi RES$ for driving the pixels 201 are supplied from the vertical selection circuit 102, on a row basis. The vertical signal line 208 for taking out a signal from a pixel is shared by pixels in the same column. Here, the vertical signal lines 208 in the first to fourth columns are denoted by reference numerals 208_1, 208_2, 208_3, and 208_4. The area 1 and the area 2 each have the connection points 115 for connecting the vertical signal lines 208 to the column circuits 103. The connection point 115 included in the vertical signal line 208_1 is denoted by reference numeral 115_1. Further, the column circuit 103 connected to the vertical signal line 208_1 is denoted by reference numeral 103_1, and the column memory 104 connected to the column circuit 103_1 is denoted by reference numeral 104_1. The area 2 includes the horizontal selection circuits 105 each for transferring signals from the column memory 104 to the output circuit 107. Each horizontal selection circuit 105 transfers signals from the column memory 104 to the output circuit 107 on a time-series basis.

Although not shown, one of the area 1 and the area 2 includes the above-mentioned constant current source 209 in addition to the illustrated components. The constant current source 209 may be included in the column circuit 103. Further, in addition, for example, one of the area 1 and the area 2 includes a timing generator or a control circuit which provides a timing signal to the vertical selection circuit 102, the horizontal selection circuit 105, and the column circuit 103, etc., and a serial communication interface, and a digital-to-analog converter.

Various kinds of pulses are supplied from the timing generator etc., to each horizontal selection circuit 105, and hence it is desirable that the horizontal selection circuits 105 are disposed close to respective ends of the chip. As shown in FIG. 14, by arranging the connection point 115 in the vicinity of the center of the chip in a direction along each column, it is possible to arrange the horizontal selection circuits 105 in the vertical direction.

A cross-sectional structure of the image pickup device according to the present embodiment is substantially the same as that according to the first embodiment shown in FIG. 5, and hence illustration and description thereof are omitted.

As shown in FIG. 14, by sharing the connection point 115 on each vertical signal line (column signal line) between pixels, the number of connection points is smaller than in a case where the connection points are provided on a pixel basis, so that it is possible to solve a problem that yields are reduced due to a formation error of connection points. It is to be understood that the number of connection points is not limited to one, but the connection point may be provided in plurality taking into account the yields. In the present embodiment, each vertical signal line in the area 1 is shared between the pixels, whereby it is not necessary to connect the area 1 and the area 2, on a pixel-by-pixel basis.

Figure 15:
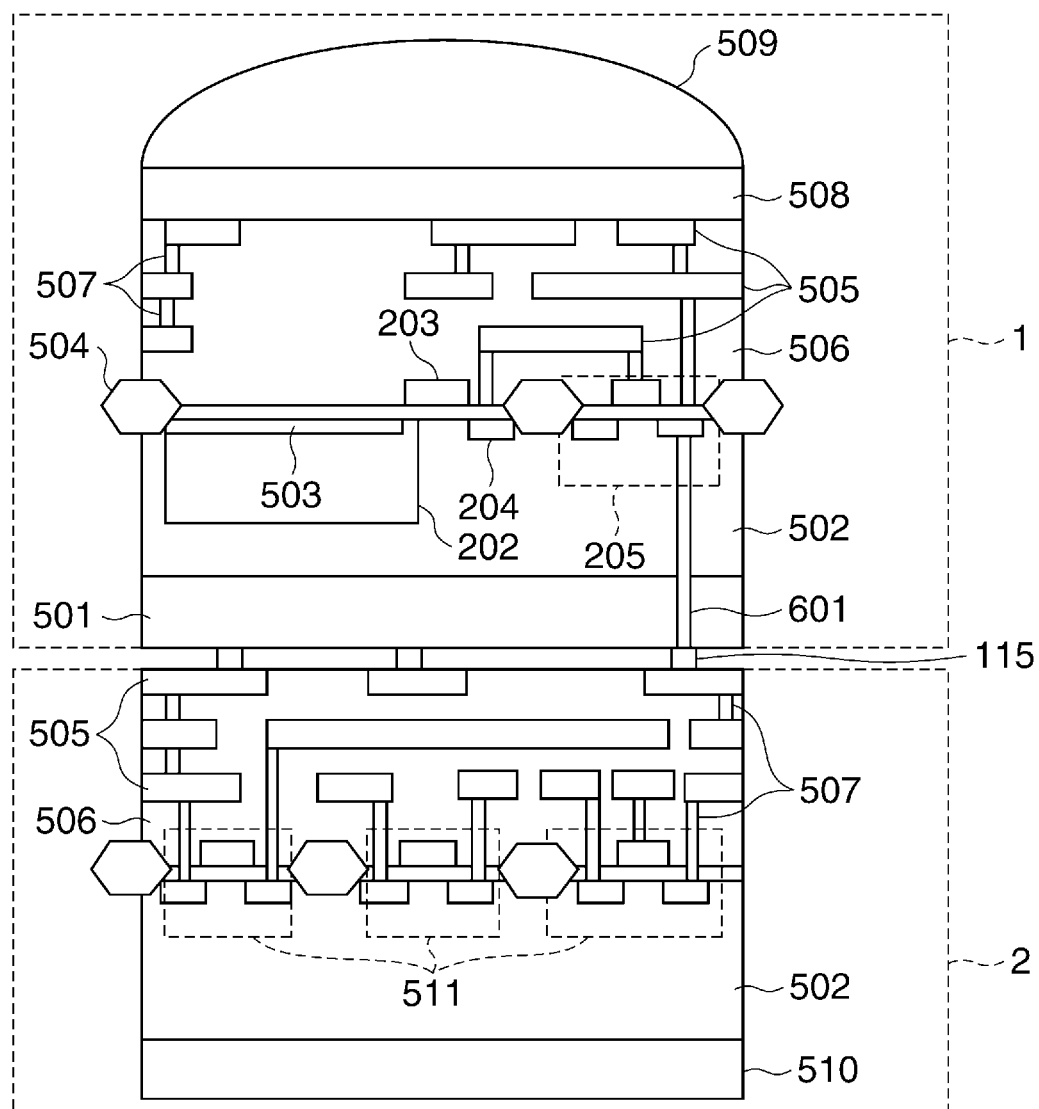
FIG. 15 is a cross-sectional view of an image pickup device as a variation of the third embodiment.

Although in the present embodiment, there is illustrated the first semiconductor substrate in which a light receiving section is formed by a back side illumination type, the light receiving section may be formed by a front side illumination type instead of the back side illumination type. FIG. 15 is a view showing a cross-sectional structure of the front side illumination type as a variation of the present embodiment. FIG. 15 shows the structure in which the area 1 as the first semiconductor substrate is laminated on the area 2 as the second semiconductor substrate. Description of components denoted by the same reference numerals as those shown in FIG. 5 is omitted. In the front side illumination type, the micro lens 509 is disposed on top of the interconnection layer 505 with respect to the semiconductor substrate 501. In the front side illumination type, through vias 601 are formed to connect the connection points 115 and the components in the area 1.

A cross-sectional structure according to a fourth embodiment of the present invention in which the area 1 and the area 2 of the front side illumination type are formed on the same substrate 501 is substantially the same as the cross-sectional structure of the second embodiment shown in FIG. 8, and hence illustration and description thereof are omitted, but as described above, in this case, the connection points 115 are formed by the through vias 601 to connect the vertical signal lines 208 and the circuits on the backside.

Figure 16:
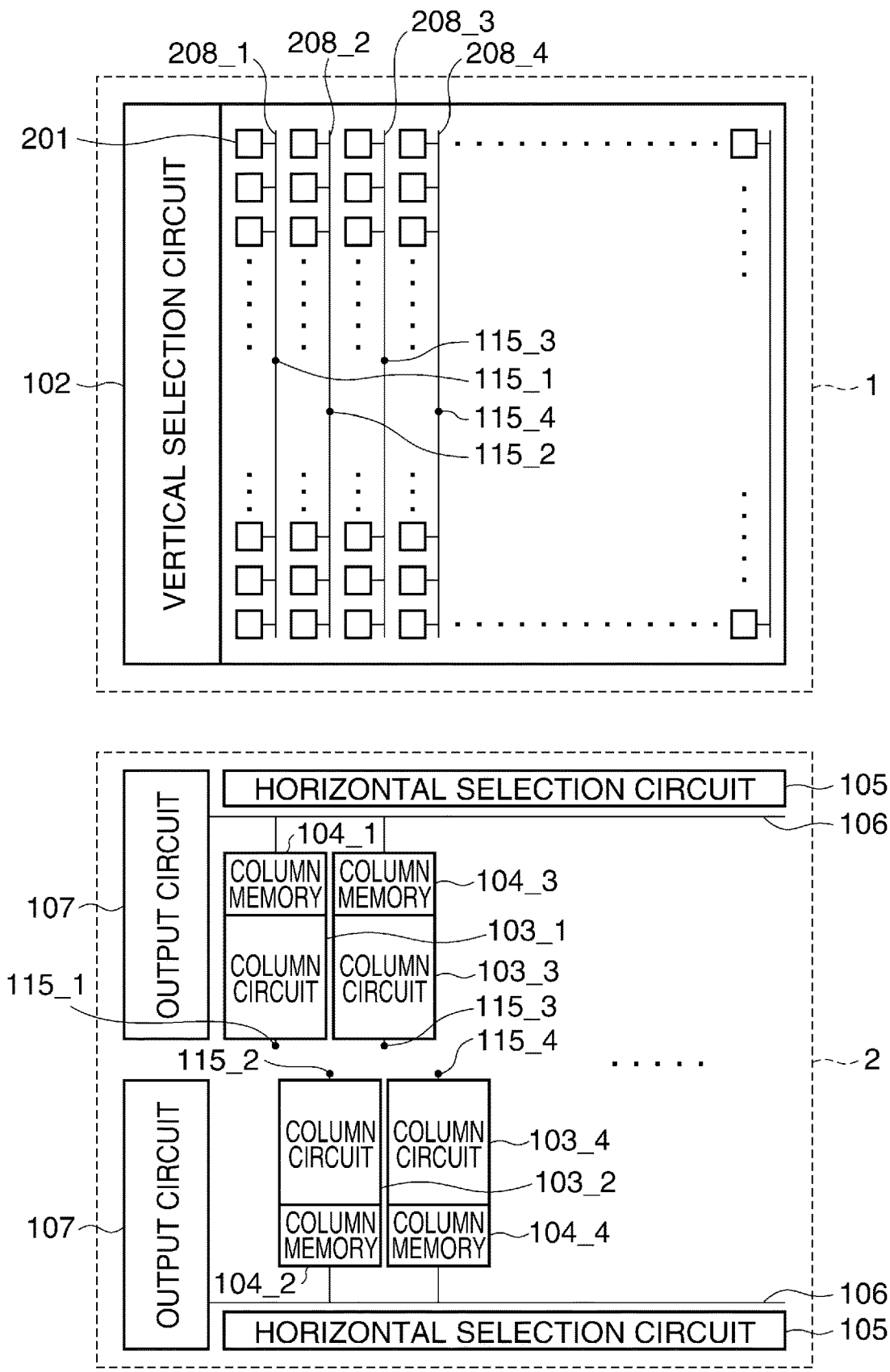
FIG. 16 is a diagram of the overall configuration of an image pickup device according to a fifth embodiment of the present invention, as viewed from above.
Figure 17:
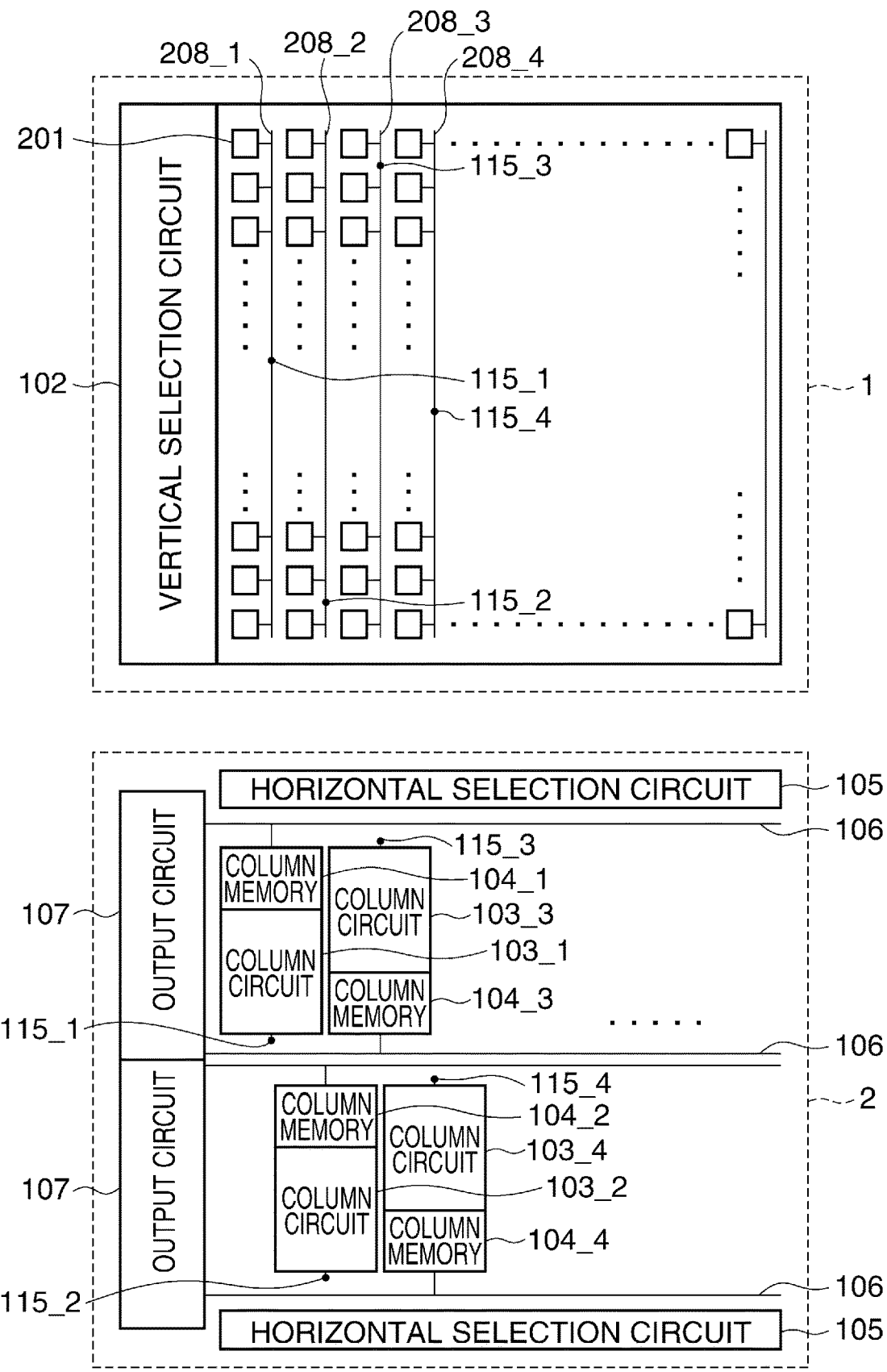
FIG. 17 is a diagram of a variation of the overall configuration of the image pickup device according to the fifth embodiment, as viewed from above.
Figure 18:
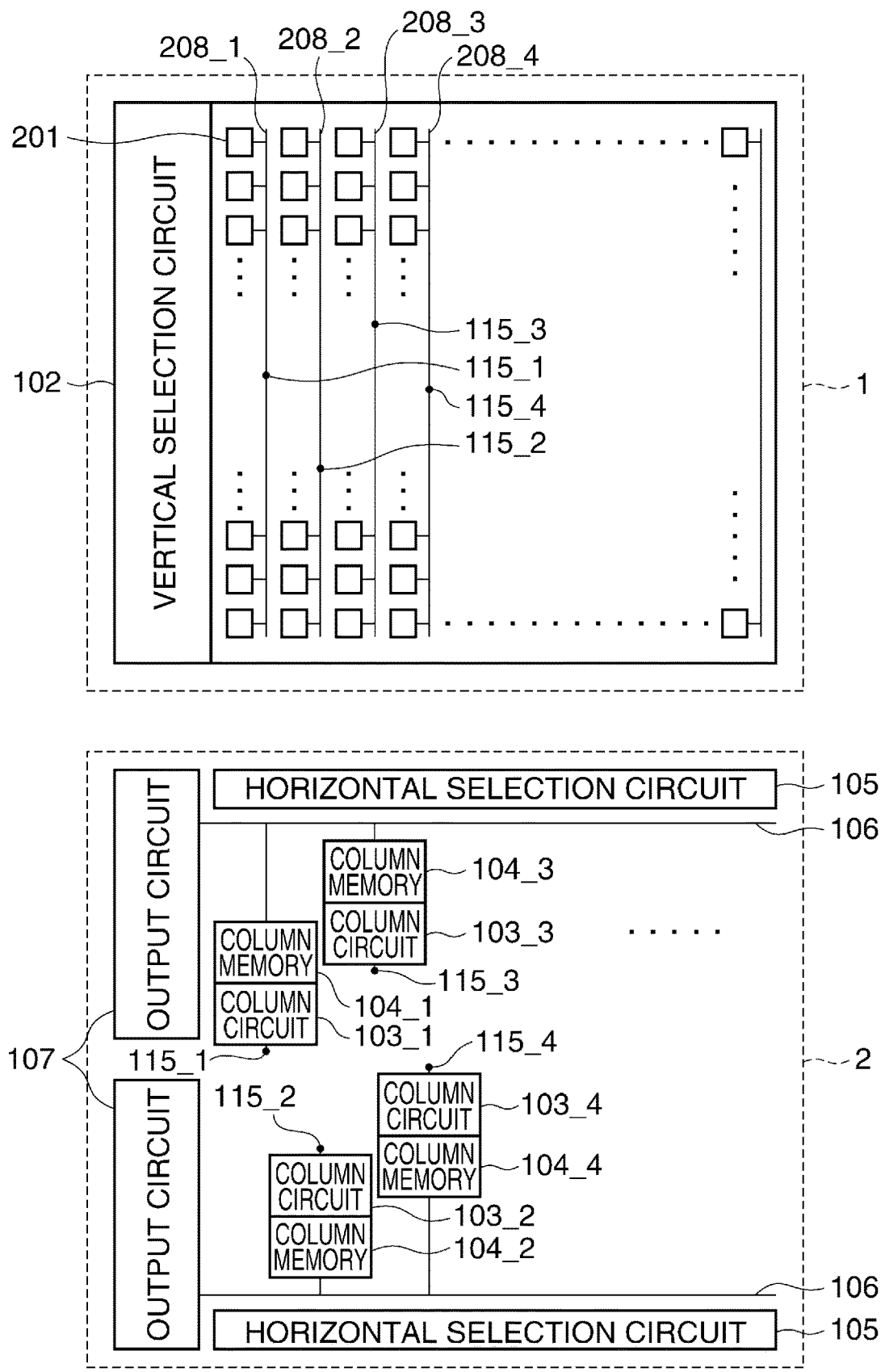
FIG. 18 is a diagram of another variation of the overall configuration of the image pickup device according to the fifth embodiment, as viewed from above.

FIG. 16 is a diagram of the overall configuration of an image pickup device according to a fifth embodiment of the present invention, as viewed from above. FIGS. 17 and 18 are diagrams of respective variations thereof.

Differently from FIG. 14, in the overall configuration of the image pickup device according to the fifth embodiment shown in FIG. 16, the connection points 115_1 and 115_2 as the connection points 115 are displaced in the direction along each column, whereby it is possible to dispose the connection points 115 immediately close to the column circuits 103_1 and 103_2. This reduces the length of interconnections in the area 2, and makes it possible to further efficiently arrange the column circuits 103 etc.

In the variation shown in FIG. 17, the connection points 115_1, 115_2, 115_3, and 115_4 are displaced, whereby it is possible to arrange the column circuits 103_1 to 103_4 in a sparse or unconcentrated manner. In the case of the arrangement shown in FIG. 14, in which the column circuits 103 are concentrated in a particular area, heat generated in the column circuits 103 is concentrated, whereby non-uniformity of dark current within a screen-associated region of a shot image is caused by the PDs 202 which receive heat from the column circuits 103. However, with the arrangement of the circuit configuration shown in FIG. 17, it is possible to reduce non-uniformity of dark current within the screen-associated region due to heat generation in the column circuits 103. In FIG. 17, by reversing the arrangement of the column circuit 103_1 and the column memory 104_1, and the column circuit 103_3 and the column memory 104_3, the column circuits 103 are dispersed. To this end, the arrangement is improved such that an output signal line 106 is also disposed in the center along the direction of each column. However, in the case of the arrangement illustrated in FIG. 18 in which the column circuits 103 and the column memories 104 can be sufficiently reduced in size, it is not necessary to dispose the output line in the center, and the column circuits 103_1 and 103_3 may be arranged in the same direction.

As described above, by displacing the connection points 115 on a column-by-column basis, it is possible to efficiently arrange the circuits, and realize the arrangement which reduces the influence of heat generation by the column circuits 103.

Figure 19:
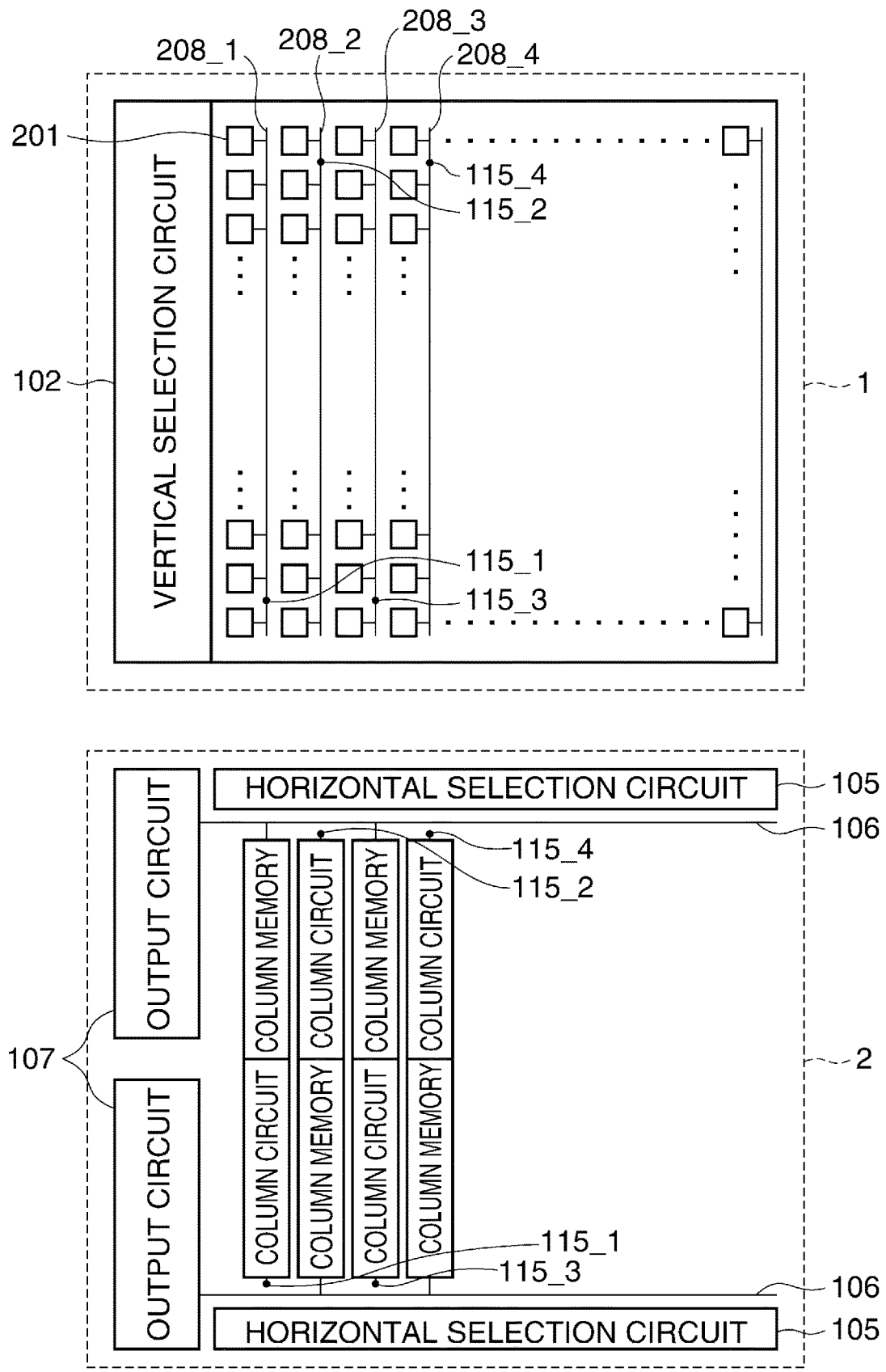
FIG. 19 is a diagram of the overall configuration of an image pickup device according to a sixth embodiment of the present invention, as viewed from above.
Figure 20:
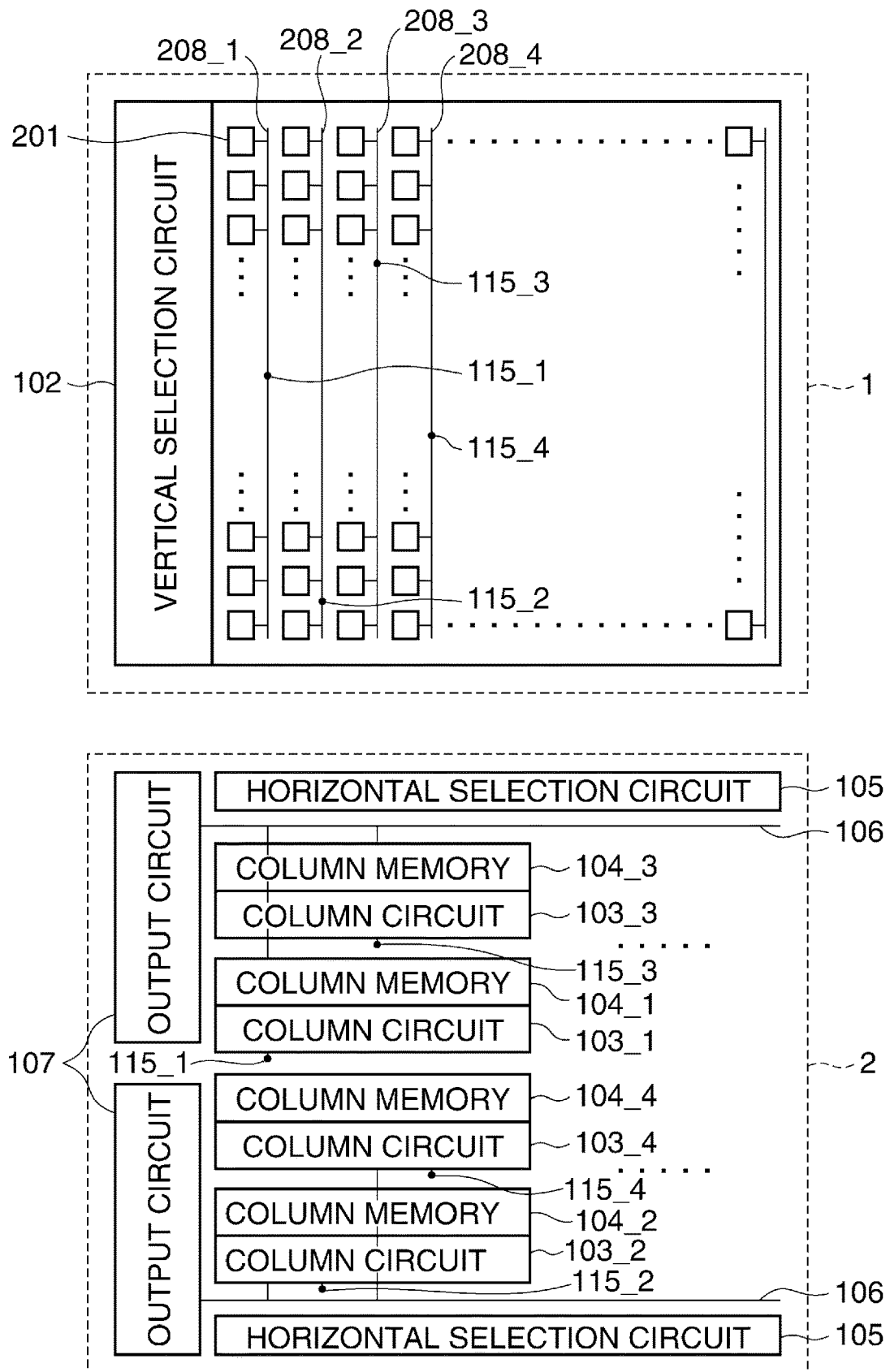
FIG. 20 is a diagram of a variation of the overall configuration of the image pickup device according to the sixth embodiment, as viewed from above.

FIG. 19 is a diagram of the overall configuration of an image pickup device according to a sixth embodiment of the present invention, as viewed from above. FIGS. 20 and 21 are diagrams of respective variations thereof.

Although in FIGS. 14, 16, 17, and 18, the column circuit 103 and the column memory 104 are illustrated as the circuits having a width corresponding to two columns in the direction along each row, this is not limitative, but the column circuit 103 and the column memory 104 can be differently configured in the present invention. For example, as shown in FIG. 19, the column circuit 103 and the column memory 104 may have a width corresponding to one column in the direction along each row. However, the column circuit 103 and the column memory 104 are increased in length in the direction along each column, and become vertically still longer. The column circuit 103 and the column memory 104 are isolated from the adjacent column circuit 103 and the column memory 104 in the element isolation region, and hence it is possible to achieve a more excellent area efficiency when the column circuit 103 and the column memory 104 are formed in an area closer to a square in shape. In the variation shown in FIG. 20, the column circuit 103 and the column memory 104 have a width corresponding to four columns in the direction along each row. Although the column circuit 103 and the column memory 104 look horizontally long in the schematic diagram, in actuality, to make the area for the circuits closer to a square in shape, by displacing the connection points 115 on a column-by-column basis, it is possible to provide such a layout. As shown the variation in FIG. 21, with the increase in the width of the column circuit 103 and the column memory 104 in the direction along each line, it is possible to dispose a plurality of output signal lines 106. The output signal lines 106 do not consume electric power, and hence by increasing the number of the output signal lines 106 and disposing them between the column circuits 103 and the column memories 104, it is possible to disperse heat generation.

Figure 22:
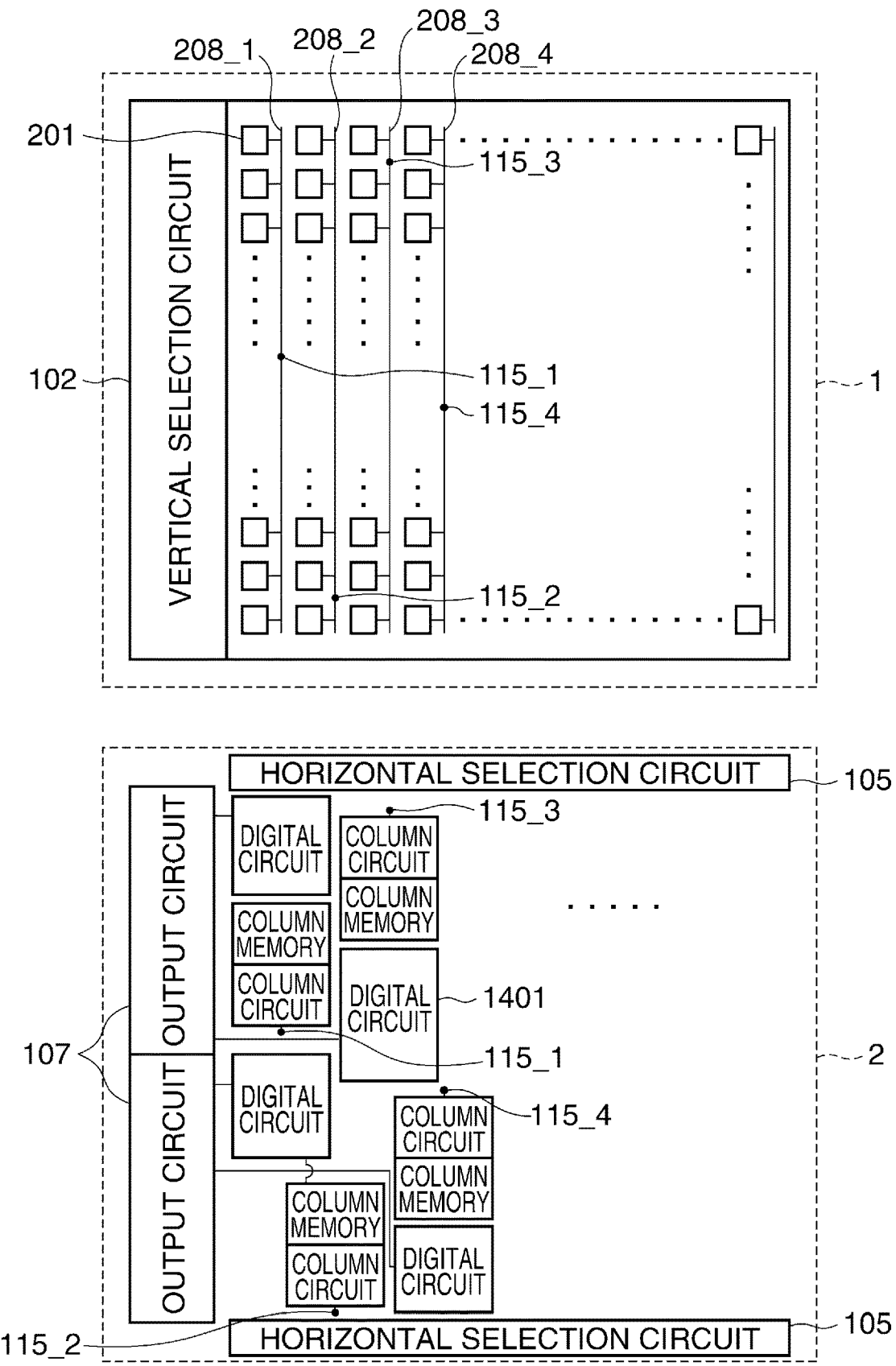
FIG. 22 is a diagram of the overall configuration of an image pickup device according to a seventh embodiment of the present invention, as viewed from above.

FIG. 22 is a diagram of the overall configuration of an image pickup device according to a seventh embodiment of the present invention, as viewed from above. Although the arrangement shown in FIG. 22 is configured based on the same concept as that of the arrangement shown in FIG. 17, if the column circuit 103 and the column memory 104 are small in size, vacant space is formed between the circuits. In a case where the column AD is mounted as in the case illustrated in FIG. 12, it is possible to dispose digital circuits 1401. Each digital circuit 1401 is capable of performing various kinds of correction processing, such as gamma correction, and image processing, such as white balance adjustment, on signals output from the column memories 104. The arrangement is not limited to the examples shown in FIGS. 17 and 21, but by arranging the column circuits 103 in a dispersed manner, the digital circuits 1401 may be also arranged in a dispersed manner, whereby it is also possible to reduce non-uniformity of dark current due to heat generation by the digital circuits 1401. Further, when the column ADs are mounted, the horizontal selection circuits 105 are not necessarily required.

Figure 23:
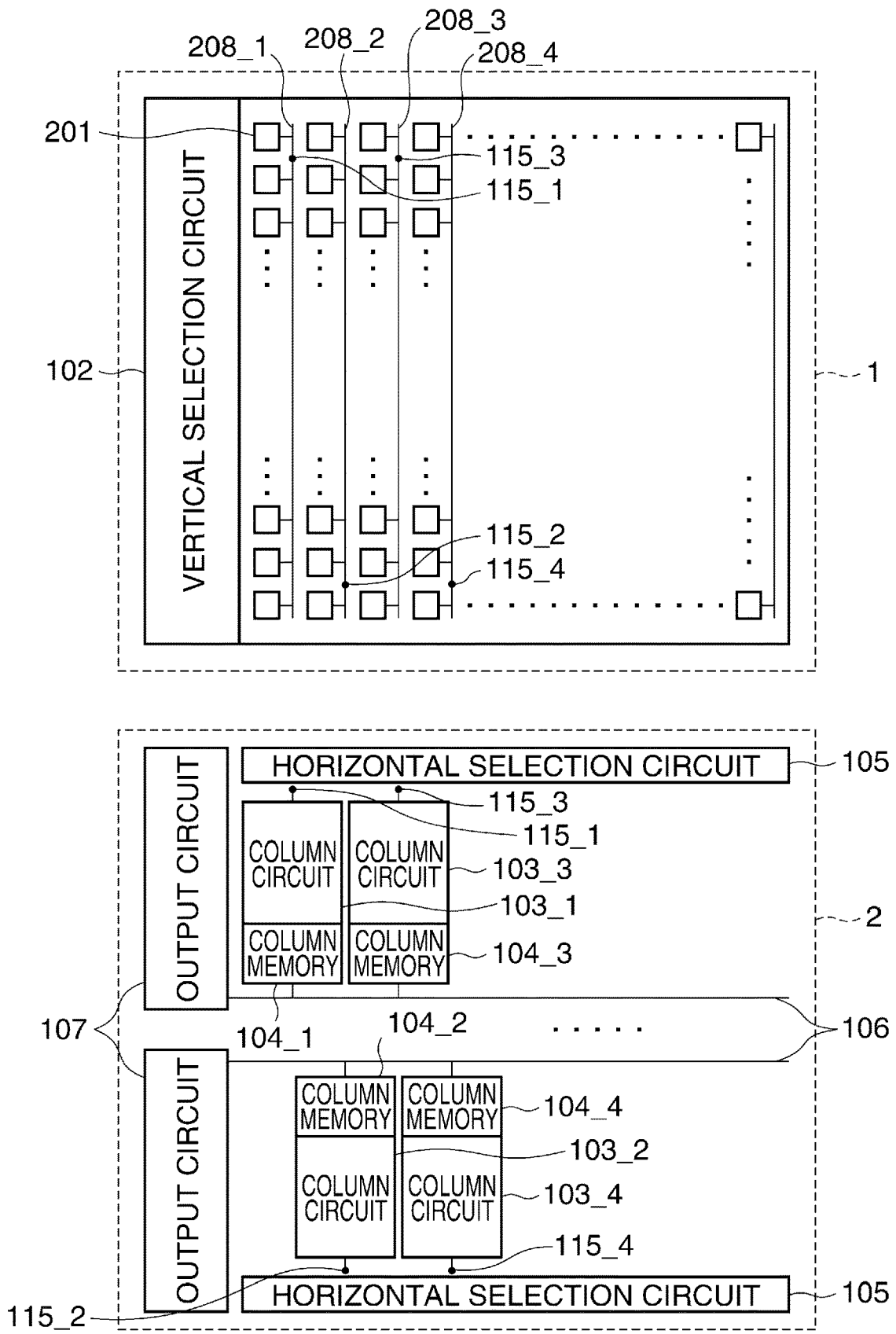
FIG. 23 is a diagram of the overall configuration of an image pickup device according to an eighth embodiment of the present invention, as viewed from above.

FIG. 23 is a diagram of the overall configuration of an image pickup device according to an eighth embodiment of the present invention, as viewed from above. In FIG. 23, the connection points 115 are disposed at vertically one-sided locations. In this case, although it is not possible to reduce non-uniformity of dark current, the arrangement is effective for forming the through vias, as shown in FIGS. 15 and 8. When the characteristics of the pixels 201 in the vicinity of the connection points 115 are degraded due to formation of the through vias, it is possible to make the corresponding pixels having low characteristics unnoticeable as an image, by displacing the connection points 115 toward the upper and lower regions which are relatively unnoticeable within the screen.

Figure 25:
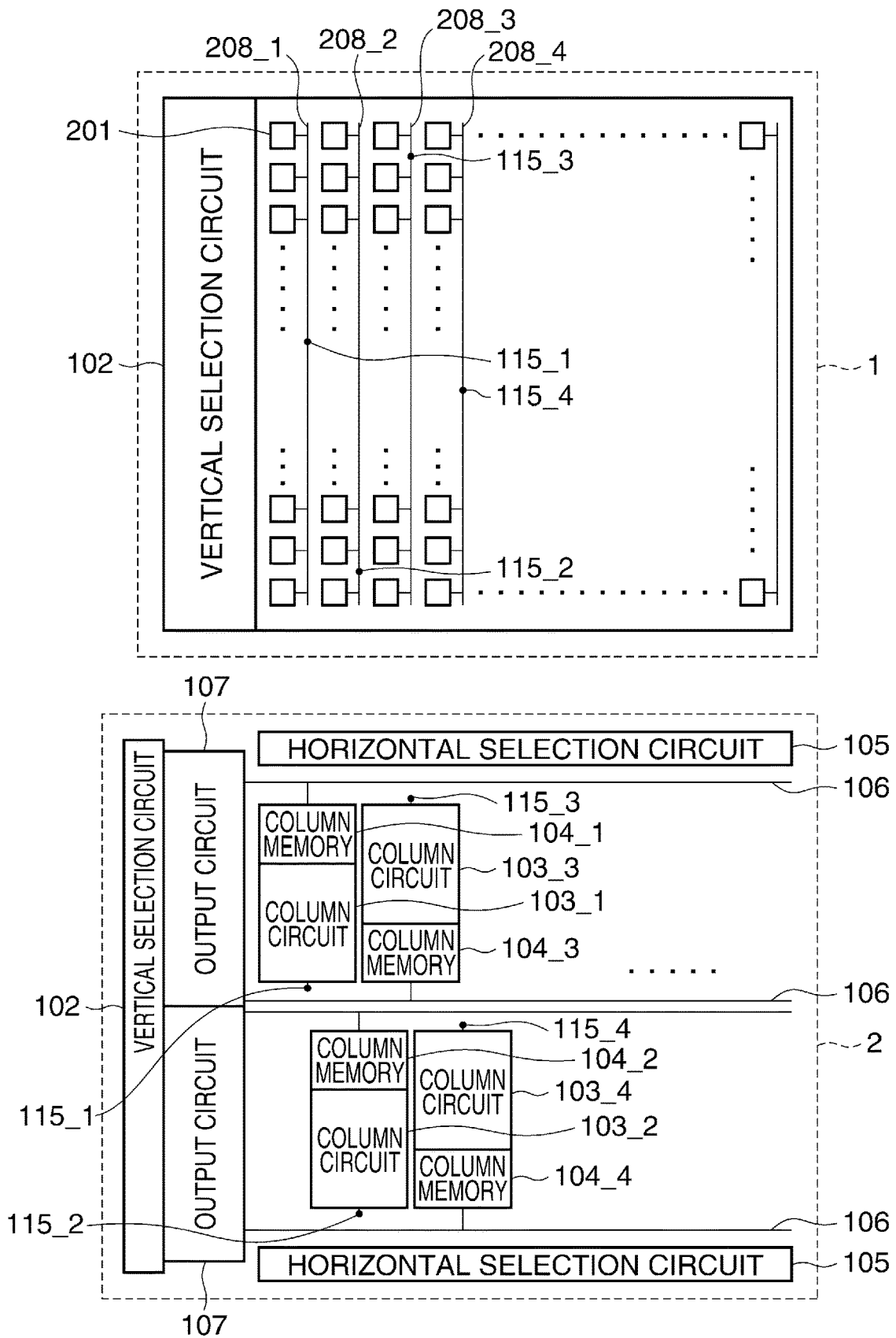
FIG. 25 is a diagram of a variation of the overall configuration of the image pickup device according to the ninth embodiment, as viewed from above.
Figure 27:
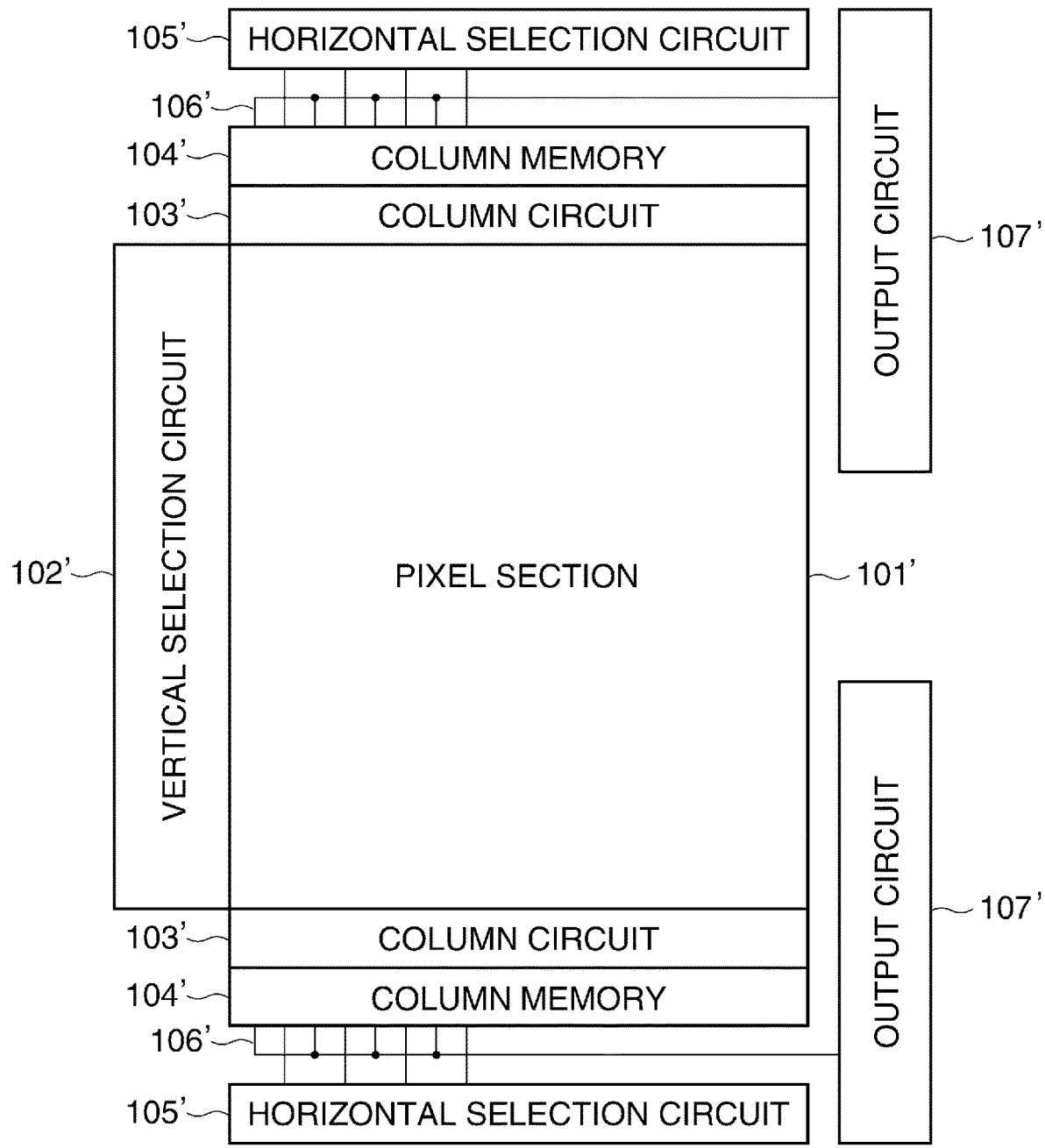
FIG. 27 is a schematic block diagram useful in explaining a conventional image pickup device.
Figure 28:
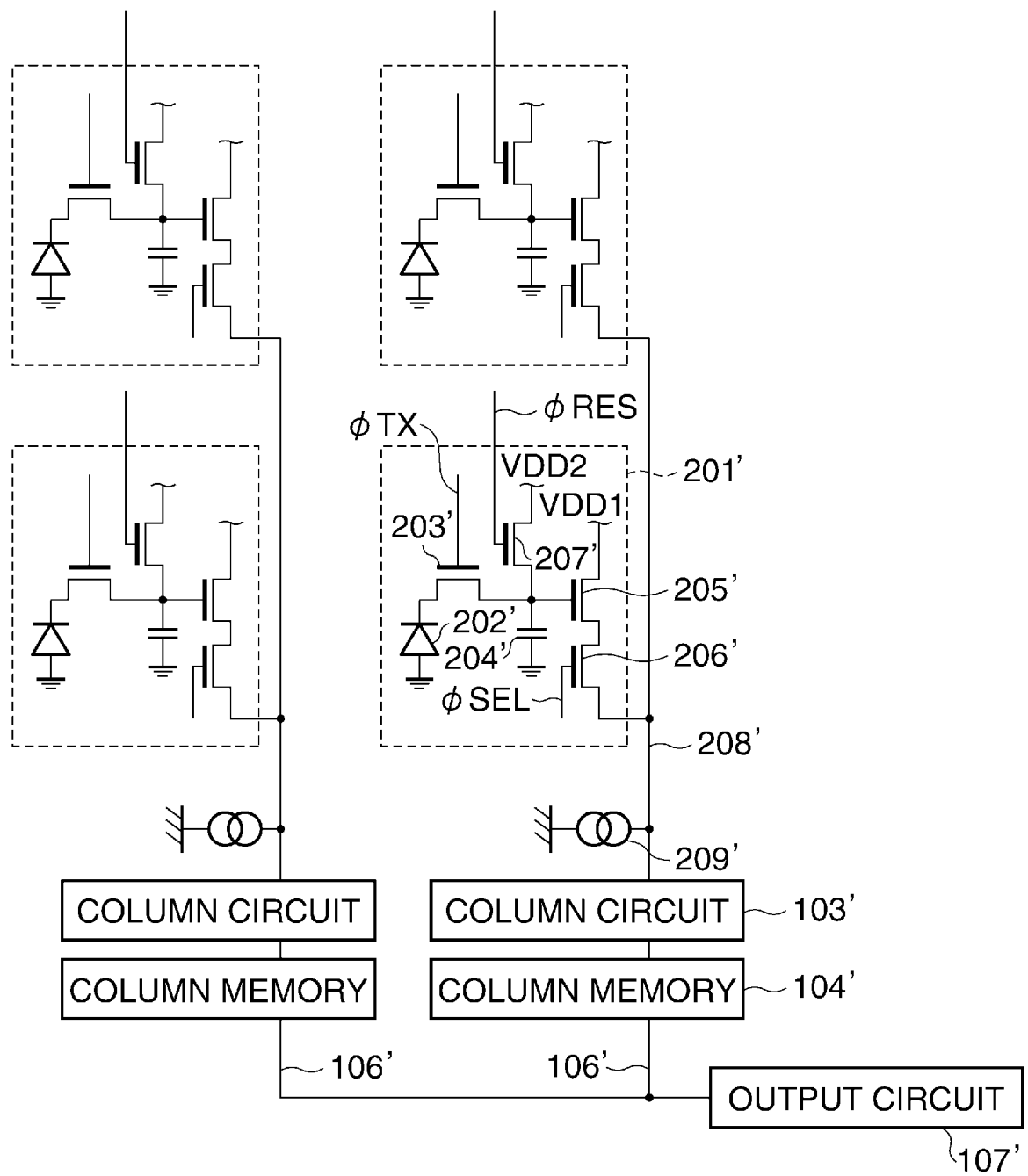
FIG. 28 is a diagram showing the configuration of one pixel in the conventional image pickup device, and a circuit configuration for reading out a signal from the pixel.

FIG. 24 is a diagram of the overall configuration of an image pickup device according to a ninth embodiment of the present invention, as viewed from above. FIGS. 25 and 26 are diagrams of respective variations thereof.

Although in the above-described circuit configuration, the vertical selection circuit 102 is formed in the area 1, and the output circuits 107 are formed in the area 2, this is not limitative. As shown in FIG. 24, the output circuits 107 may be formed in the area 1. In this case, the output signal lines 106 and the output circuits 107 are connected between the area 1 and the area 2. As schematically shown in FIG. 24, the area 1 and the area 2 are not required to be the same in size. Further, as shown in the variation in FIG. 25, part of the vertical selection circuit 102 may be formed in the area 2. In this configuration, a drive buffer of the vertical selection circuit 102 for driving the pixels 201 can be moved to the area 1, and the digital section of the same can be moved to the area 2. Further, as shown in the variation in FIG. 26, it is possible to arrange the output circuits 107 such that they do not extend in the horizontal direction, but extend in the vertical direction. When the column circuits are small in the vertical direction, it is possible to make the area 1 and the area 2 nearly equal in size by adopting such a layout.

The configuration and operations of the digital camera as an image pickup apparatus using the image pickup device according to any of the above-described embodiments and variations thereof are the same as those described with reference to FIG. 10, and hence description thereof is omitted.

Aspects of the present invention can also be realized by a computer of a system or apparatus (or devices such as a CPU or MPU) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (e.g., computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-169291 filed Aug. 2, 2011, and Japanese Patent Application No. 2012-159605 filed Jul. 18, 2012, which are hereby incorporated by reference herein in their entirety.

What is claimed is:
1. An image pickup device comprising:
a first semiconductor substrate and a second semiconductor substrate which are stacked on each other;
a pixel section including a plurality of pixels arranged in matrix form;
a plurality of column signal lines which have signals output thereto from the plurality of pixels;
a plurality of column circuits each including an AD converter; and
output circuits configured to output signals on which predetermined processing has been performed by the plurality of column circuits,
wherein the pixel section and the plurality of column signal lines are formed on an area of the first semiconductor substrate,
wherein the plurality of column signal lines formed on the area of the first semiconductor substrate are arranged in parallel with each other at a same interval,
wherein the plurality of column circuits is formed on an area of the second semiconductor substrate so that the plurality of column circuits overlaps the pixel section when the image pickup device is viewed from a side where light enters,
wherein a first column signal line among the plurality of column signal lines formed on the area of the first semiconductor substrate and a first column circuit among the plurality of column circuits formed on the area of the second semiconductor substrate are electrically connected at a first connection point, wherein a second column signal line among the plurality of column signal lines formed on the area of the first semiconductor substrate and a second column circuit among the plurality of column circuits formed on the area of the second semiconductor substrate are electrically connected at a second connection point, wherein a third column signal line among the plurality of column signal lines formed on the area of the first semiconductor substrate and a third column circuit among the plurality of column circuits formed on the area of the second semiconductor substrate are electrically connected at a third connection point, wherein a fourth column signal line among the plurality of column signal lines formed on the area of the first semiconductor substrate and a fourth column circuit among the plurality of column circuits formed on the area of the second semiconductor substrate are electrically connected at a fourth connection point, wherein the first connection point, the second connection point, the third connection point, and the fourth connection point are arranged at respective different locations in a direction along columns of the plurality of pixels, and wherein the first connection point, the second connection point, the third connection point, and the fourth connection point are arranged on respective different sides of the first column circuit, the second column circuit, the third column circuit, and the fourth column circuit from output ends of the first column circuit, the second column circuit, the third column circuit, and the fourth column circuit that output signals to the corresponding output circuits, and at respective locations not overlapping with the first column circuit, the second column circuit, the third column circuit, and the fourth column circuit.

2. The image pickup device according to claim 1, wherein the plurality of column circuits are arranged uniformly in the direction along the columns.

3. The image pickup device according to claim 1, wherein column circuits for at least two adjacent columns among the plurality of column circuits are arranged at respective different locations in the direction along the columns.

4. The image pickup device according to claim 1, further comprising digital circuits configured to perform predetermined image processing, arranged on the area of the second semiconductor substrate.

5. The image pickup device according to claim 1, further comprising:
drive circuits configured to drive the pixel section.

6. The image pickup device according to claim 5, wherein at least part of the drive circuits is formed on the area of the first semiconductor substrate.

7. The image pickup device according to claim 1, wherein each of the plurality of pixels of the pixel section comprises a photoelectric conversion element configured to generate electric charges by photoelectric conversion, a floating diffusion configured to temporarily store the electric charges generated in the photoelectric conversion element, and an amplifier configured to output a signal which depends on a potential of the floating diffusion.

8. The image pickup device according to claim 7, wherein each of the plurality of pixels further comprises a transfer unit configured to transfer the electric charges from the photoelectric conversion element to the floating diffusion, and a reset unit configured to reset the floating diffusion.

9. An image pickup apparatus comprising:
(A) an image pickup device comprising: (1) a first semiconductor substrate and a second semiconductor substrate which are stacked on each other; (2) a pixel section including a plurality of pixels arranged in matrix form; (3) a plurality of column signal lines which have signals output thereto from the plurality of pixels; (4) a plurality of column circuits each including an AD converter; and (5) output circuits configured to output signals on which predetermined processing has been performed by the plurality of column circuits, wherein the pixel section and the plurality of column signal lines are formed on an area of the first semiconductor substrate, wherein the plurality of column signal lines formed on the area of the first semiconductor substrate are arranged in parallel with each other at a same interval, wherein the plurality of column circuits is formed on an area of the second semiconductor substrate so that the plurality of column circuits overlaps the pixel section when the image pickup device is viewed from a side where light enters, wherein a first column signal line among the plurality of column signal lines formed on the area of the first semiconductor substrate and a first column circuit among the plurality of column circuits formed on the area of the second semiconductor substrate are electrically connected at a first connection point, wherein a second column signal line among the plurality of column signal lines formed on the area of the first semiconductor substrate and a second column circuit among the plurality of column circuits formed on the area of the second semiconductor substrate are electrically connected at a second connection point, wherein a third column signal line among the plurality of column signal lines formed on the area of the first semiconductor substrate and a third column circuit among the plurality of column circuits formed on the area of the second semiconductor substrate are electrically connected at a third connection point, wherein a fourth column signal line among the plurality of column signal lines formed on the area of the first semiconductor substrate and a fourth column circuit among the plurality of column circuits formed on the area of the second semiconductor substrate are electrically connected at a fourth connection point, wherein the first connection point, the second connection point, the third connection point, and the fourth connection point are arranged at respective different locations in a direction along columns of the plurality of pixels, and wherein the first connection point, the second connection point, the third connection point, and the fourth connection point are arranged on respective different sides of the first column circuit, the second column circuit, the third column circuit, and the fourth column circuit from output ends of the first column circuit, the second column circuit, the third column circuit, and the fourth column circuit that output signals to the corresponding output circuits, and at respective locations not overlapping with the first column circuit, the second column circuit, the third column circuit, and the fourth column circuit;
(B) a recording device configured to record signals output from the image pickup device into a storage medium;
(C) a display device configured to display an image based on signals output from the image pickup device; and (D) a controller configured to control an entire device including the image pickup device, the recording device, and the display device.

10. The image pickup apparatus according to claim 9, further comprising:
   a lens unit configured to form an optical image of an object into an image on the image pickup device; and
   a lens drive unit configured to drive and control the lens unit.

11. The image pickup apparatus according to claim 9, wherein in the image pickup device, the plurality of column circuits are arranged uniformly in the direction along the columns.

12. The image pickup apparatus according to claim 9, wherein in the image pickup device, column circuits for at least two adjacent columns among the plurality of column circuits are arranged at respective different locations in the direction along the columns.

13. The image pickup apparatus according to claim 9, wherein the image pickup device further comprises digital circuits configured to perform predetermined image processing, arranged on the area of the second semiconductor substrate.

14. The image pickup apparatus according to claim 9, wherein the image pickup device further comprises drive circuits configured to drive the pixel section.

15. The image pickup apparatus according to claim 14, wherein in the image pickup device, at least part of the drive circuits is formed on the area of the first semiconductor substrate.

16. The image pickup apparatus according to claim 9, wherein in the image pickup device, each of the plurality of pixels of the pixel section comprises a photoelectric conversion element configured to generate electric charges by photoelectric conversion, a floating diffusion configured to temporarily store the electric charges generated in the photoelectric conversion element, and an amplifier configured to output a signal which depends on a potential of the floating diffusion.

17. The image pickup apparatus according to claim 16, wherein in the image pickup device, each of the plurality of pixels further comprises a transfer unit configured to transfer the electric charges from the photoelectric conversion element to the floating diffusion, and a reset unit configured to reset the floating diffusion.

* * * * *